(12) United States Patent
Nagahara

(10) Patent No.: US 6,774,028 B2
(45) Date of Patent: Aug. 10, 2004

(54) METHOD OF FORMING WIRING STRUCTURE BY USING PHOTO RESIST HAVING OPTIMUM DEVELOPMENT RATE

(75) Inventor: Seiji Nagahara, Tokyo (JP)

(73) Assignee: NEC Electronics Corporation (JP)

( * ) Notice: Subject to any disclaimer, the term of this patent is extended or adjusted under 35 U.S.C. 154(b) by 129 days.

(21) Appl. No.: 10/166,362

(22) Filed: Jun. 11, 2002

(65) Prior Publication Data
US 2002/0192945 A1 Dec. 19, 2002

(30) Foreign Application Priority Data
Jun. 14, 2001 (JP) ........................................ 2001-179995

(51) Int. Cl.[7] .......................................... H01L 21/4763
(52) U.S. Cl. ........................ 438/624; 438/636; 438/637; 438/638; 438/782
(58) Field of Search ......................... 438/624, 636–638, 438/782

(56) References Cited

U.S. PATENT DOCUMENTS

| | | | |
|---|---|---|---|
| 6,319,821 B1 * 11/2001 | Liu et al. | ..................... | 438/636 |
| 6,323,121 B1 * 11/2001 | Liu et al. | ..................... | 438/633 |
| 6,391,472 B1 * 5/2002 | Lamb, III et al. | .......... | 428/624 |
| 2001/0056144 A1 * 12/2001 | Lamb, III et al. | .......... | 524/377 |
| 2002/0016057 A1 * 2/2002 | Lamb, III et al. | .......... | 438/618 |
| 2002/0041953 A1 * 4/2002 | Lamb, III et al. | .......... | 428/195 |

FOREIGN PATENT DOCUMENTS

| JP | 6-140518 | 5/1994 |
|---|---|---|
| JP | 2000-188330 | 7/2000 |

OTHER PUBLICATIONS

Theodore H. Fedynshyn, "Advances in Resist Technology and Processing XIX," Proceedings of SPIE, (Mar. 4–6, 2002), pp. 586–597 vol. 4690, CA.

* cited by examiner

Primary Examiner—Lynne Gurley

(57) ABSTRACT

A multi-layer wiring structure is formed by using a dual damascene method. First and second interlayer insulating films formed on a lower conductor layer are etched by using a first photo resist film as a mask to form a via hole. An anti-reflective coating is formed on the second interlayer insulating film such that a portion of the via hole is also filled therewith. A second photo resist film is formed on the anti-reflective coating such that a remaining portion of the via hole is also filled therewith. A development rate of an exposed portion of the second photo resist film is selected to be 250–700 nm/second. A wiring trench pattern is formed in the second photo resist film, and the anti-reflective coating and the second interlayer insulating film is etched by using the second photo resist film as a mask to form a wiring trench. The via hole and the wiring trench are filled with a conductive material to form a via and a wiring conductor.

20 Claims, 17 Drawing Sheets 21, 22 ; CURVES $R_{min}$ ; MINIMUM DEVELOPMENT RATE $R_{max}$ ; MAXIMUM DEVELOPMENT RATE $E_{opt}$ ; OPTIMUM EXPOSURE ENERGY

23 ; CURVE
24 ; TANGENTIAL LINE

PRIOR ART

PRIOR ART

PRIOR ART

PRIOR ART

PRIOR ART

PRIOR ART

FIG. 17

| | NO. | SAMPLES | PHOTO RESIST | | REMOVABILITY FOCUS RANGE (μm) | RECTANGULARITY |
|---|---|---|---|---|---|---|
| | | | MAX DEVELOPMENT RATE (nm/s) | MIN DEVELOPMENT RATE (nm/s) | | |
| COMPARATIVE EXAMPLE | 1 | RESIST A | 800 | 0.10 | 0.7 | × |
| EXAMPLE | 2 | RESIST B | 600 | 0.01 | 0.3 | ○ |
| EXAMPLE | 3 | RESIST C | 450 | 0.22 | 0.6 | ○ |
| EXAMPLE | 4 | RESIST D | 400 | 0.31 | 0.5 | ○ |
| EXAMPLE | 5 | RESIST E | 320 | 0.35 | 0.3 | ◎ |
| EXAMPLE | 6 | RESIST F | 260 | 0.01 | 0.3 | ◎ |
| COMPARATIVE EXAMPLE | 7 | RESIST H | 100 | 0.01 | UNREMOVED | ◎ |
| COMPARATIVE EXAMPLE | 8 | RESIST I | 90 | 0.01 | UNREMOVED | ◎ |
| COMPARATIVE EXAMPLE | 9 | RESIST J | 60 | 0.02 | UNREMOVED | ◎ |

METHOD OF FORMING WIRING STRUCTURE BY USING PHOTO RESIST HAVING OPTIMUM DEVELOPMENT RATE

FIELD OF THE INVENTION

The present invention relates generally to a method of forming a wiring structure by using a via-first dual damascene method which is used for forming a multi-layer wiring structure and the like of a semiconductor device. More particularly, the present invention relates to a method of forming a wiring structure by using a via-first dual damascene method in which a development rate of a photo resist film is optimized.

BACKGROUND OF THE INVENTION

As a method of forming wiring conductors having a multi-layer structure in a semiconductor integrated circuit device, there is known a damascene wiring technology. Among the damascene wiring technology, a dual damascene technology has merits of simplifying a manufacturing process and shortening a Turn-and-Around-Time (TAT), and of greatly reducing manufacturing costs of a semiconductor integrated circuit device. In the dual damascene technology, wiring trenches for forming upper layer wiring conductors and via holes or contact holes (hereafter, referred to as via holes including both of the via holes and contact holes) for forming vias or via conductors which couple the upper layer wiring conductors and lower layer wiring conductors or substrates are formed in an insulating film, and thereafter the wiring trenches and the via holes are filled at the same time with a metal material to form the upper layer wiring conductors and the via conductors at the same time. Especially, among the dual damascene method, a via-first dual damascene method in which via holes are formed before forming wiring trenches has the merit of reducing unevenness of a photo resist film in an etching process for forming the via holes. Thereby, it becomes possible to perform minuter work of the dual damascene structure. As the photo resist, there are known a positive type photo resist and a negative type photo resist. In the dual damascene method, the positive type photo resist is generally used, because the positive type photo resist has high image resolution and many kinds of positive type photo resist materials are available.

With reference to the drawings, an explanation will be made on an example of a method of forming wiring conductors according to a conventional via-first dual damascene method. FIGS. 11A–11C, FIGS. 12A–12C and FIGS. 13A–13C are cross sectional views each illustrating a structure of a workpiece during a process of fabricating a dual damascene structure according to the conventional via-first dual damascene method.

First, as shown in FIG. 11A, an etching stopper film 7 made of SiCN is formed on a lower wiring layer 8. Then, an interlayer insulating film 6 made of $SiO_2$ is formed on the etching stopper film 7, and an etching stopper film 5 made of SiC is formed on the interlayer insulating film 6. Further, an interlayer insulating film 4 made of ladder oxide is formed on the etching stopper film 5, and $SiO_2$ is plasma deposited on the interlayer insulating film 4, thereby a cap film 3 is formed.

Then, a bottom anti-reflective coating (BARC) not shown in the drawing is applied on the cap film 3, and further a photo resist film not shown in the drawing is applied thereon. The photo resist film is then exposed by using KrF (krypton fluoride) excimer laser, and thereafter developed. Thereby, a via hole pattern is formed by a photolithography technology.

As shown in FIG. 11B, by using the photo resist film (not shown in the drawing) in which the via hole pattern is formed as a photo mask, the bottom anti-reflective coating (not shown in the drawing), the cap film 3, the interlayer insulating film 4, the etching stopper film 5 and the interlayer insulating film 6 are etched, thereby a via hole 9 reaching the etching stopper film 7 is formed. In the drawing, only one via hole 9 is shown. However, it is also possible to form many via holes at the same time. Thereafter, by using $O_2$ plasma ashing and organic remover, the photo resist film and the bottom anti-reflective coating are removed.

Next, as shown in FIG. 11C, another bottom anti-reflective coating 2 made of organic material is formed on the cap film 3 and within the via hole 9. In this case, the bottom anti-reflective coating 2 is formed such that the via hole 9 is completely filled with the material of the bottom anti-reflective coating 2. That is, the via hole 9 is full-filled with the material of the bottom anti-reflective coating 2.

As shown in FIG. 12A, positive type photo resist material is applied on the bottom anti-reflective coating 2 and, thereby, a photo resist film 11 is formed on the bottom anti-reflective coating 2.

Then, as shown in FIG. 12B, the photo resist film 11 is exposed by using KrF excimer laser, and thereafter developed. Thereby, a trench pattern is formed by a photolithography technology.

As shown in FIG. 12C, by using the photo resist film 11 as a mask, the bottom anti-reflective coating 2 is anisotropically etched back by $O_2$ plasma. In this case, a portion of the bottom anti-reflective coating 2 within the via hole 9 is etched away at least up to the level corresponding to the etching stopper film 5.

As shown in FIG. 13A, by using the photo resist 11 as a mask, the cap film 3 and the interlayer insulating film 4 are etched away and a wiring trench or groove 10 is formed.

Then, as shown in FIG. 13B, by using $O_2$ plasma ashing and organic remover, the photo resist film 11 and the bottom anti-reflective coating 2 are removed.

As shown in FIG. 13C, the via hole 9 and the wiring trench 10 are filled with conductive material 12 such as Cu, and, by using a Chemical Mechanical Polishing (CMP) method, the surface of the cap film 3 is planarized. Thereby, all the conductive material 12 on the cap film 3 and almost all portion of the cap film 3 are removed, and a desired wiring structure is completed.

However, in the conventional method of forming wiring conductors mentioned above, it is necessary, in the process illustrated in FIG. 12C, to anisotropically etch back the bottom anti-reflective coating 2 made of organic material to a thickness of 300–600 nm. In such anisotropic etching back, it is difficult to precisely control the lateral size of the via hole and the like.

In order to solve such problem, there is known a method in which a via hole is not filled wholly with a material of a bottom anti-reflective coating but the via hole is partially filled with the material. That is, the via hole is not full-filled but partial-filled with the material of the bottom anti-reflective coating. With reference to the drawings, an explanation will be made on such method. FIGS. 14A–14C, FIGS. 15A–15C and FIGS. 16A–16C are cross sectional views each illustrating a structure of a workpiece during a process of fabricating a dual damascene structure according to such partially filling via-first dual damascene method. In these drawings, portions identical or corresponding to those in FIGS. 11A–11C, FIGS. 12A–12C and FIGS. 13A–13C used before for illustrating the above-mentioned fully filling method are designated by the same reference numerals, and detailed description thereof is omitted here.

First, as shown in FIG. 14A, on a lower wiring layer 8, an etching stopper film 7, an interlayer insulating film 6, an etching stopper film 5, an interlayer insulating film 4, and a cap film 3 are formed in this order. Then, a bottom anti-reflective coating (BARC) not shown in the drawing is applied on the cap film 3, and further a photo resist film not shown in the drawing is formed thereon. The photo resist film is then exposed by using KrF (krypton fluoride) excimer laser, and thereafter developed. Thereby, a via hole pattern is formed by a photolithography technology.

As shown in FIG. 14B, by using the photo resist film (not shown in the drawing) in which the via hole pattern is formed as a photo mask, the bottom anti-reflective coating (not shown in the drawing), the cap film 3, the interlayer insulating film 4, the etching stopper film 5 and the interlayer insulating film 6 are etched, thereby a via hole 9 reaching the etching stopper film 7 is formed. Thereafter, by using $O_2$ plasma ashing or organic remover, the photo resist film and the bottom anti-reflective coating are removed.

Next, as shown in FIG. 14C, a bottom anti-reflective coating 2 made of organic material is applied on the cap film 3 and within the via hole 9. In this case, the bottom anti-reflective coating 2 is formed such that the via hole 9 is partially filled with the material of the bottom anti-reflective coating 2. That is, the via hole 9 is partial-filled with the material of the bottom anti-reflective coating 2.

As shown in FIG. 15A, a positive type photo resist material or film 11 is applied within the via hole 9 and on the bottom anti-reflective coating 2. In this case, the photo resist material 11 fills the space on the bottom anti-reflective coating 2 within the via hole 9.

Then, as shown in FIG. 15B, the photo resist film 11 is exposed by using KrF excimer laser, and thereafter developed. Thereby, a trench pattern is formed by a photolithography technology. In this case, a portion of the photo resist film 11 remains within the via hole 9.

As shown in FIG. 15C, by using the photo resist film 11 in which the trench pattern is formed as a mask, a portion of the bottom anti-reflective coating 2 on the cap film 3 is removed.

As shown in FIG. 16A, by using the photo resist film 11 as a mask, the cap film 3 and the interlayer insulating film 4 are etched away and a wiring trench or groove 10 is formed.

Then, as shown in FIG. 16B, by using $O_2$ plasma ashing and organic remover, the photo resist film 11 and the bottom anti-reflective coating 2 are removed.

As shown in FIG. 16C, the via hole 9 and the wiring trench 10 are filled with conductive material 12. The conductive material is 12 is, for example, copper (Cu). Thereby, a via conductor or via 14 and a wiring conductor 15 are formed. By using a Chemical Mechanical Polishing (CMP) method, the surface of the cap film 3 is then planarized. Thereby, all of the conductive material 12 on the cap film 3 and almost all of the cap film 3 are removed by CMP, and a desired wiring structure is completed.

When forming the wiring structure according to the above-mentioned partial-filling method, it is possible to shorten a process of anisotropically etching back the bottom anti-reflective coating 2 by using $O_2$ plasma removal described before in the process illustrated in FIG. 12C. Thereby, it is possible to suppress lateral expansion of the opening of the photo resist film 11 and to precisely control the lateral size thereof.

However, the above-mentioned conventional methods have the following problems. That is, in the method of forming a wiring structure according to the above-mentioned partial-filling technology, there is a problem that, in the process illustrated in FIG. 15C, a portion of the photo resist film 11 filling the via hole 9 does not melt away completely but partially remains within the via hole 9. This is because, laser light of the KrF excimer laser does not reach the portion of the photo resist film 11 within the via hole 9 sufficiently in the exposure process. The photo resist film 11 is made of positive type photo resist and, when exposed by the laser light, it becomes dissoluble in the developer. Therefore, if the photo resist film 11 is not exposed well by the laser light, the development rate in the developer does not become sufficiently high and the photo resist film 11 partially remains within the via hole 9.

On the other hand, in the process illustrated with reference to FIG. 14B, when the via hole 9 is formed by etching, a cross sectional area of an upper opening portion of the via hole 9 becomes larger than the cross sectional area of the bottom portion thereof, because of a characteristic of an etching behavior. Therefore, the side surface of the via hole 9 becomes slightly inclined such that an upper portion of the side surface warps backward or outside. Since the side surface of the via hole 9 is inclined, if the material of the photo resist film 11 buried in the via hole 9 remains, the cross sectional area of an upper portion of the remained material of the photo resist film 11 also becomes larger than a cross sectional area of a lower portion thereof, so that the side surface of the remained photo resist portion overhangs outside at upper portions.

Therefore, when, in the process illustrated in FIG. 16A, the cap film 3 and the interlayer insulating film 4 are etched, a portion of the material of the photo resist film 11 which overhangs outside becomes a mask for the interlayer insulating film 4 and the cap film 3. Therefore, an etching residue 13 of the interlayer insulating film 4 or the cap film 3 is produced just under the overhung portion. The etching residue 13 is formed so as to surround the opening portion of the via hole 9, and, therefore, is called a crown. The etching residue 13 can not be removed by the $O_2$ ashing and the treatment by the organic remover which are performed for removing the photo resist film 11 and the bottom anti-reflective coating 2. Therefore, the etching residue 13 remains even after removing the photo resist film 11 and the bottom anti-reflective coating 2 by the $O_2$ ashing and the treatment by the organic remover, and is buried within the conductive material portion 12. As a result, reliability of the fabricated wiring structure deteriorates.

In order to completely dissolve the material of the photo resist film 11 within the via hole 9, it is conceivable to make the development time longer than the conventional time. However, when the development time is made longer, the width of the wiring trench 10 becomes large, and it is difficult to form a minute wiring structure.

SUMMARY OF THE INVENTION

Therefore, it is an object of the present invention to provide a method of fabricating a multi-layer wiring structure which uses a dual damascene process and in which a minute wiring structure can be formed with high reliability and with high precision.

It is another object of the present invention to provide a method of fabricating a multi-layer wiring structure which uses a dual damascene process and in which etching residue surrounding each opening portion of a via hole is not produced and, therefore, a so-called crown is not formed.

It is still another object of the present invention to provide a method of fabricating a multi-layer wiring structure which uses a dual damascene process and in which the lateral size of each via hole can be easily and precisely controlled.

It is still another object of the present invention to obviate the disadvantages of the conventional method of fabricating a multi-layer wiring structure which uses a dual damascene process.

According to a first aspect of the present invention, there is provided a method of forming a wiring structure by using a dual damascene process comprising: forming a first interlayer insulating film on a lower conductive layer; forming a second interlayer insulating film on the first interlayer insulating film; forming a first photo resist film on the second interlayer insulating film, the first photo resist film having an opening for forming a via hole; etching the first and second interlayer insulating films by using the first photo resist film as a mask to form a via hole; forming an anti-reflective coating on the second interlayer insulating film such that a portion of the via hole is also filled with the material of the anti-reflective coating; forming a second photo resist film on the anti-reflective coating such that a remaining portion of the via hole is also filled with the material of the second photo resist film, a development rate of an exposed portion of the second photo resist film being 250–700 nm/second; exposing and developing the second photo resist film by using a photolithography technology and thereby forming an opening for forming a wiring trench in the second photo resist film; etching the anti-reflective coating and the second interlayer insulating film by using the second photo resist film as a mask to form a wiring trench; removing the second photo resist film and the anti-reflective coating; and filling the via hole and the wiring trench with a conductive material to form a via portion which is coupled with the lower conductive layer and a wiring conductor portion which is coupled with the via portion.

In this case, it is preferable that, in said etching the anti-reflective coating, the level of an upper surface of the anti-reflective coating in the via hole after etching is lower than the level of an upper surface of the first interlayer insulating film.

It is also preferable that a development rate of an unexposed portion of the second photo resist film is 0.05–0.4 nm/second.

It is further preferable that the second photo resist film is made of a methacrylate resist material, and the second photo resist film is exposed by using ArF excimer laser.

It is advantageous that the second photo resist film is made of an acetal photo resist material or an ESCAP resist material, and the second photo resist film is exposed by using KrF excimer laser.

It is also advantageous that the method further comprises, after said filling the via hole and the wiring trench with a conductive material to form a via portion and a wiring conductor portion, removing the conductive material on the second interlayer insulating film by CMP.

It is further advantageous that the method further comprises forming a first etching stopper film between the lower conductive layer and the first interlayer insulating film, and wherein, in said etching the first and second interlayer insulating films to form a via hole, said etching is stopped at the first etching stopper film.

It is preferable that the method further comprises forming a second etching stopper film between the first interlayer insulating film the second interlayer insulating film 6, and wherein, in said etching the second interlayer insulating films to form a wiring trench, said etching is stopped at the second etching stopper film.

It is also preferable that the first interlayer insulating film is formed of $SiO_2$.

It is further preferable that the second interlayer insulating film is formed of at least one kind of materials selected from a group consisting of silicon oxide, ladder oxide, SiLK and SiOF.

It is advantageous that the conductive material is copper or copper alloy.

It is also advantageous that the lower conductor layer is a lower wiring layer.

It is further advantageous that the lower conductor layer is an electrode layer of a transistor formed on the surface of a substrate.

According to a second aspect of the present invention, there is provided a method of forming a wiring structure by using a dual damascene process comprising: forming a first interlayer insulating film on a lower conductive layer; forming a second interlayer insulating film on the first interlayer insulating film; forming a first photo resist film on the second interlayer insulating film, the first photo resist film having an opening for forming a via hole; etching the first and second interlayer insulating films by using the first photo resist film as a mask to form a via hole; forming a second photo resist film on the second photo resist film such that the via hole is also filled with the material of the second photo resist film, a development rate of an exposed portion of the second photo resist film being 250–700 nm/second; exposing and developing the second photo resist film by using a photolithography technology and thereby forming an opening for forming a wiring trench in the second photo resist film; etching the second interlayer insulating film by using the second photo resist film as a mask to form a wiring trench; removing the second photo resist film; and filling the via hole and the wiring trench with a conductive material to form a via portion which is coupled with the lower conductive layer and a wiring conductor portion which is coupled with the via portion.

In this case, it is preferable that a development rate of an unexposed portion of the second photo resist film is 0.05–0.4 nm/second.

It is also preferable that the second photo resist film is made of a methacrylate resist material, and the second photo resist film is exposed by using ArF excimer laser.

It is further preferable that the second photo resist film is made of an acetal photo resist material or an ESCAP resist material, and the second photo resist film is exposed by using KrF excimer laser.

It is advantageous that the method further comprises, after said filling the via hole and the wiring trench with a conductive material to form a via portion and a wiring conductor portion, removing the conductive material on the second interlayer insulating film by CMP.

It is also advantageous that the method further comprises forming a first etching stopper film between the lower conductive layer and the first interlayer insulating film, and wherein, in said etching the first and second interlayer insulating films to form a via hole, said etching is stopped at the first etching stopper film.

It is further advantageous that the method further comprises forming a second etching stopper film between the first interlayer insulating film the second interlayer insulating film 6, and wherein, in said etching the second interlayer insulating films to form a wiring trench, said etching is stopped at the second etching stopper film.

In the method of fabricating a multi-layer wiring structure which uses a dual damascene process according to the above-mentioned first aspect of the present invention, the development rate of the exposed portion of the second photo resist film is selected to become 250–700 nm/second. Thereby, when the second photo resist film is exposed, even if the light energy reaching the second photo resist film buried in the via hole is smaller than the light energy reaching the second photo resist film formed on the anti-reflective coating, the second photo resist film buried in the via hole can also be sufficiently dissolved in developer when the second photo resist film is developed thereafter. Therefore, it is possible to avoid insufficient dissolution of the material of the second photo resist film buried in the via hole. Thus, when the second interlayer insulating film is etched, it is possible to prevent etching residue from being produced. As a result, it is possible to greatly improve reliability of wiring. It is also possible to maintain rectangularity of the second photo resist film, that is, it is also possible to maintain a rectangular profile of each etched cross section of the second photo resist film. Further, according to the present invention, it is possible to shorten a time for an anisotropic etching back process of the anti-reflective coating portion buried in the via hole and, therefore, the lateral size of each opening of the second photo resist film can be controlled easily.

Also, when etching the anti-reflective coating, the level of an upper surface of the anti-reflective coating in the via hole after etching is lower than the level of an upper surface of the first interlayer insulating film. Therefore, when the second interlayer insulating film is etched, it is possible to effectively prevent etching residue from being produced due to the masking by an anti-reflective coating remained within a via hole.

In the method of fabricating a multi-layer wiring structure by using a dual damascene process according to the above-mentioned second aspect of the present invention, the development rate of the exposed portion of the second photo resist film is determined to be 250–700 nm/second. Thereby, when the second photo resist film is developed, the second photo resist film buried in the via hole can also be sufficiently dissolved in developer, while keeping the rectangular profile of the photo resist film. Therefore, it is possible to avoid occurrence of insufficient dissolution of the material of the second photo resist film buried in a via hole, and it is possible to prevent etching residue from being remained in the via hole. As a result, it is possible to greatly improve reliability of wiring. Further, since an anti-reflective coating is not formed, exposure light inputted into a via hole is reflected at the bottom portion of the second photo resist film buried into the via hole. Therefore, quantity of light reaching the second photo resist film buried in the via hole is increased and a development rate of the second photo resist film is increased. As a result, it is possible to surely prevent the second photo resist film from remaining undissolved.

Further, a development rate of an unexposed portion of the second photo resist film is selected to be 0.05–0.4 nm/second. Therefore, even when a quantity of exposed light energy inputted into the via hole is relatively small, it is possible to obtain sufficient development rate of the second photo resist film in developer, and it is possible to more surely prevent etching residue from being remained in the via hole. Also, it is possible to avoid missing of film material at unexposed portions of the second photo resist film and to improve rectangularity of profile of the second photo resist film.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 17 is a table showing maximum development rates and minimum development rates of various types of photo resist materials, together with results of evaluation of removability and rectangularity of the photo resist materials.

DESCRIPTION OF A PREFERRED EMBODIMENT

Figure 1A:
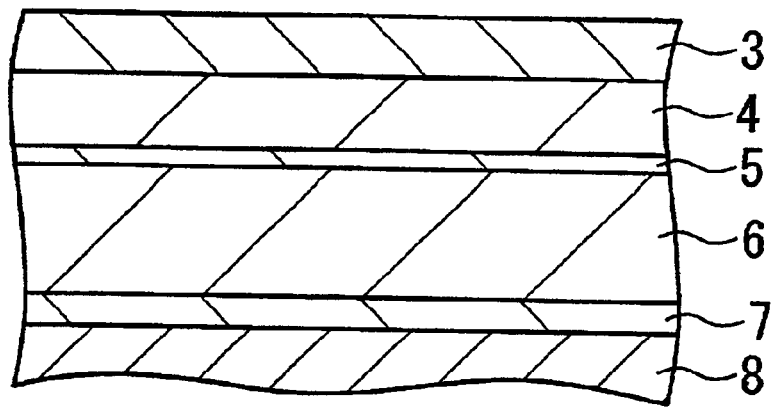
FIGS. 1A–1C are cross sectional views each illustrating in order a structure of a workpiece obtained during a process of fabricating a wiring structure according a first embodiment of the present invention.

With reference to the drawings, an explanation will now be made on embodiments of the present invention in detail.
First Embodiment FIGS. 1A–1C, FIGS. 2A–2C and FIGS. 3A–3C are cross sectional views each illustrating in order a structure of a workpiece obtained during a process of fabricating a wiring structure by using a dual damascene method according a first embodiment of the present invention. In this embodiment, an explanation will be made on a method of fabricating a wiring structure according to a partially filling method which uses an anti-reflective coating. In these drawings, portions identical or corresponding to those in the illustration of the above-mentioned conventional method are designated by the same reference numerals.

First, as shown in FIG. 1A, on a lower or bottom wiring layer 8, an etching stopper film 7 made of SiCN is formed. The thickness of the etching stopper film 7 is, for example, 70 nm. The lower wiring layer 8 is, for example, an electrode layer of a transistor, a lower wiring layer in a semiconductor device or the like. Then, an $SiO_2$ film is grown by using a plasma enhanced CVD system and, thereby, an interlayer insulating film 6 is formed which has a film thickness of, for example, 600 nm. On the interlayer insulating film 6, an etching stopper film 5 is formed which is made of SiC and which has a film thickness of, for example, 50 nm. Next, an interlayer insulating film 4 is formed which is made of ladder oxide and which has low dielectric constant and has a film thickness of, for example, 300 nm. On the interlayer insulating film 4, $SiO_2$ is deposited to a thickness of, for example, 250 nm by using a plasma enhanced CVD system, and thereby a cap film 3 is formed. The reason why the cap film 3 is formed is that, in a CMP process performed later, it is difficult to planarize the interlayer insulating film 4 made of ladder oxide by CMP. In order to cope with such problem, the cap film 3 made of $SiO_2$ is formed on the interlayer insulating film 4.

A bottom anti-reflective coating (not shown in the drawing) is then applied on the cap film 3 to a film thickness of, for example, 50 nm, and further a photo resist film (not shown in the drawing) is applied thereon. The photo resist film is then exposed by using KrF (krypton fluoride) excimer laser, and thereafter developed. Thereby, a via hole pattern is formed by a photolithography technology in the photo resist film. In the drawings, only one via hole is shown. However, in practice, it is also possible to form many via holes at the same time.

Figure 1B:
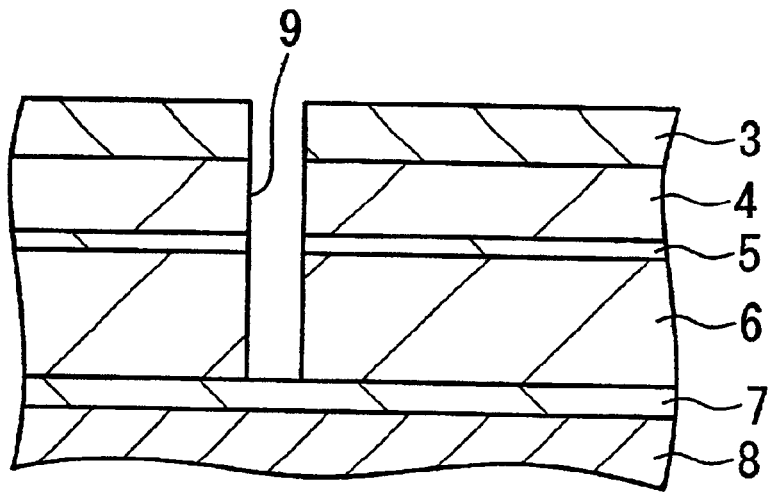

As shown in FIG. 1B, by using the photo resist film (not shown in the drawing) in which the via hole pattern is formed as a photo mask, the bottom anti-reflective coating (not shown in the drawing), the cap film 3, the interlayer insulating film 4, the etching stopper film 5 and the interlayer insulating film 6 are etched, thereby a via hole 9 reaching the etching stopper film 7 is formed. Thereafter, by using $O_2$ plasma ashing and organic remover, the photo resist film and the bottom anti-reflective coating are removed.

Figure 1C:
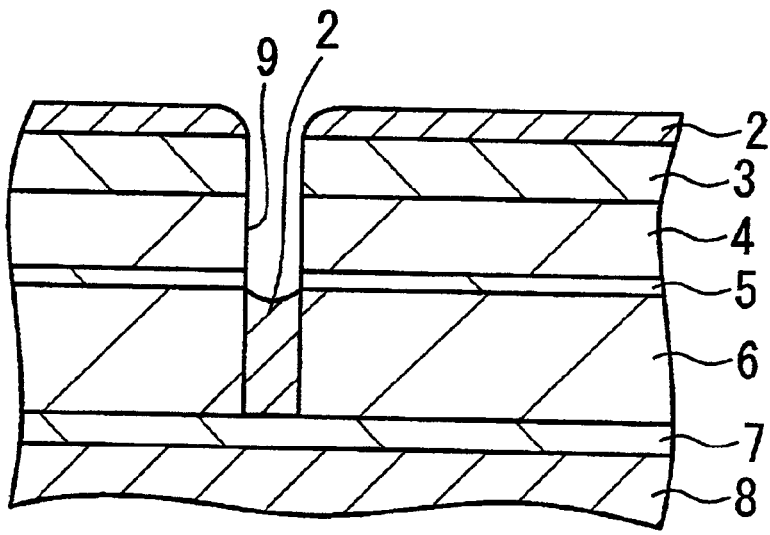

Next, as shown in FIG. 1C, a bottom anti-reflective coating 2 made of organic material is applied on the cap film 3 and within the via hole 9. In this case, the bottom anti-reflective coating 2 is formed such that the via hole 9 is partially filled with the material of the bottom anti-reflective coating 2. That is, the via hole 9 is partially-filled with the material of the bottom anti-reflective coating 2.

Figure 2A:
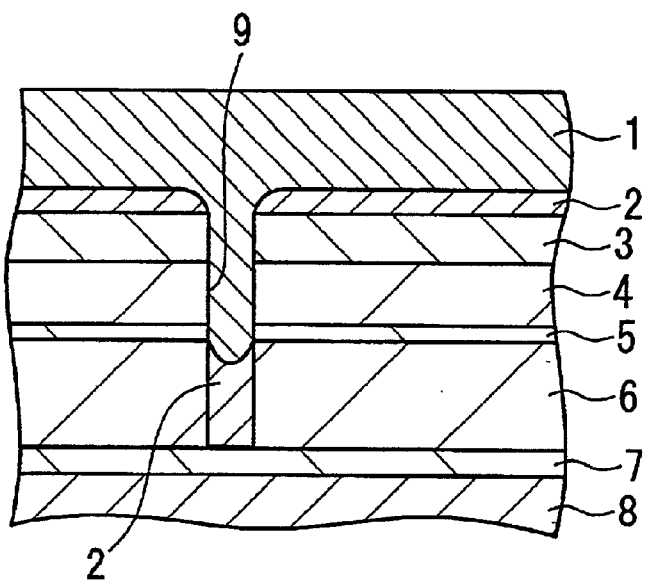
FIGS. 2A–2C are cross sectional views each illustrating in order a structure of a workpiece obtained after the structure of FIG. 1C during a process of fabricating a wiring structure according a first embodiment of the present invention.

As shown in FIG. 2A, a positive type photo resist material or film 1 is applied on the bottom anti-reflective coating 2 and within the via hole 9 such that the space on the bottom anti-reflective coating 2 within the via hole 9 is filled with the positive type photo resist material. The photo resist film 1 is selected such that a development rate (or dissolving rate) of exposed portions thereof, i.e., the maximum development rate, becomes 250–700 nm/second, and the development rate of unexposed portions thereof, i.e., the minimum development rate, becomes 0.05–0.4 nm/second. The thickness of the photo resist film 1 on the anti-reflective coating 2 is, for example, 600 nm. The photo resist film 1 may be, for example, made of acetal resist or ESCAP resist material. The acetal resist is a resist material made by adding photo acid generator and additive to a polymer in which a part of hydroxyl groups of poly(p-hydroxystyrene) are protected by acetal protecting groups. The ESCAP resist is a chemically amplified resist made by adding photo acid generator and additive to a polymer comprising a copolymer whose bases are p-hydroxystyrene, ester methacrylate and the like.

Figure 2B:
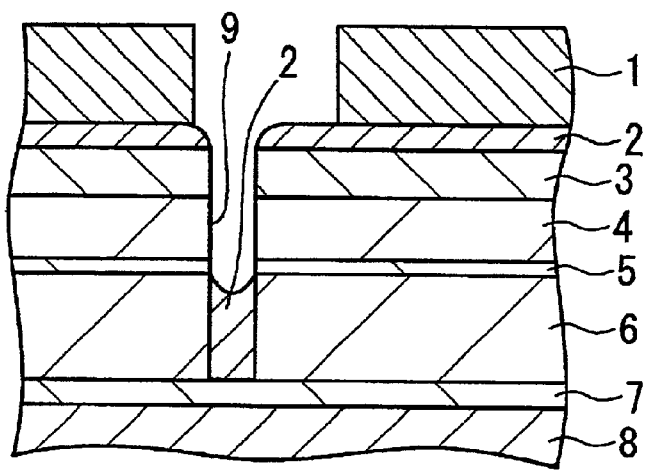

Then, as shown in FIG. 2B, the photo resist film 1 is exposed by using KrF excimer laser which has a wavelength of 248 nm by using a KrF scanner or scanning exposure system. Thereafter, the photo resist film 1 is developed and, thereby, a trench pattern is formed by a photolithography technology. In the drawings, only one trench pattern portion is shown. However, in practice, it is possible to form many trench pattern portions at the same time. In this case, for example, an aqueous solution of TMAH (tetra-methyl-ammoniumhydroxide) having a concentration of 2.38 wt % (percent by mass) is used as a developer. The development time is, for example, 30 seconds. The concentration of TMAH in the developer may be any other value in a range between 0.5 and 3 wt %. By this development process, photo resist material 1 within the via hole 9 is dissolved in the developer and removed.

Figure 2C:
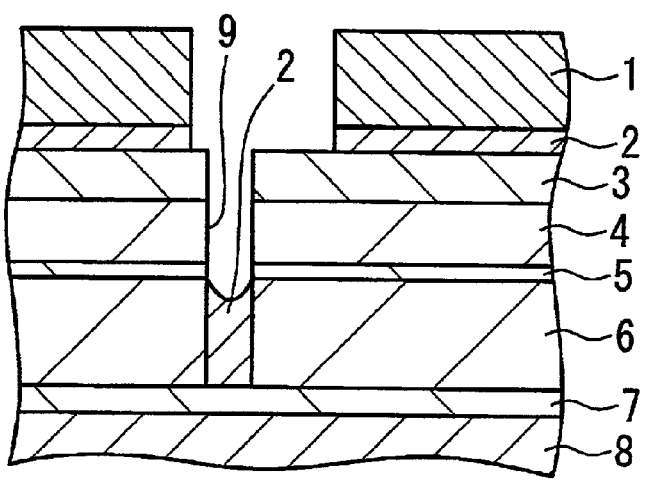

As shown in FIG. 2C, by using the photo resist film 1 in which the trench pattern is formed as a mask, a portion of the bottom anti-reflective coating 2 on the cap film 3 is removed. In this case, the portion of the bottom anti-reflective coating 2 is removed such that the level of the upper surface of the bottom anti-reflective coating 2 within the via hole 9 becomes lower than that of the upper surface of the interlayer insulating film 6.

Figure 3A:
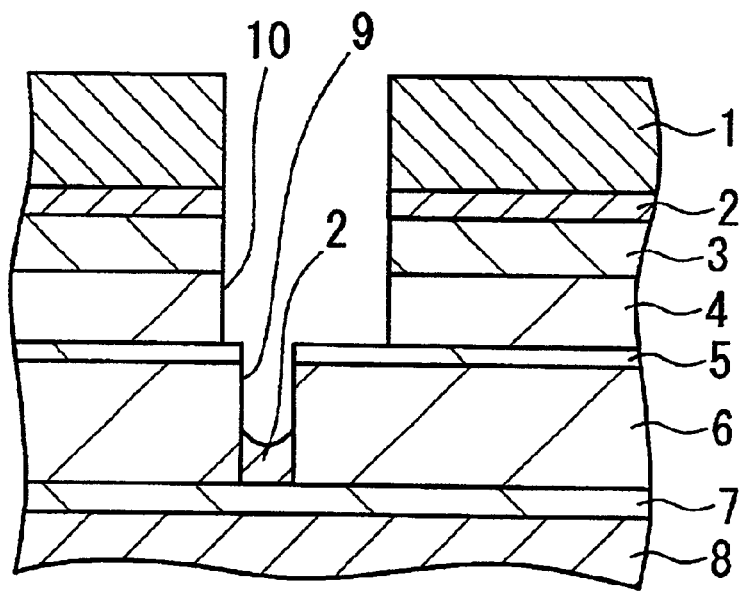
FIGS. 3A–3C are cross sectional views each illustrating in order a structure of a workpiece obtained after the structure of FIG. 2C during a process of fabricating a wiring structure according a first embodiment of the present invention.

As shown in FIG. 3A, by using the photo resist film 1 as a mask, the cap film 3 and the interlayer insulating film 4 are etched away and a wiring trench or groove 10 is formed. In this case, etching is stopped by and at the etching stopper film 5.

Figure 3B:
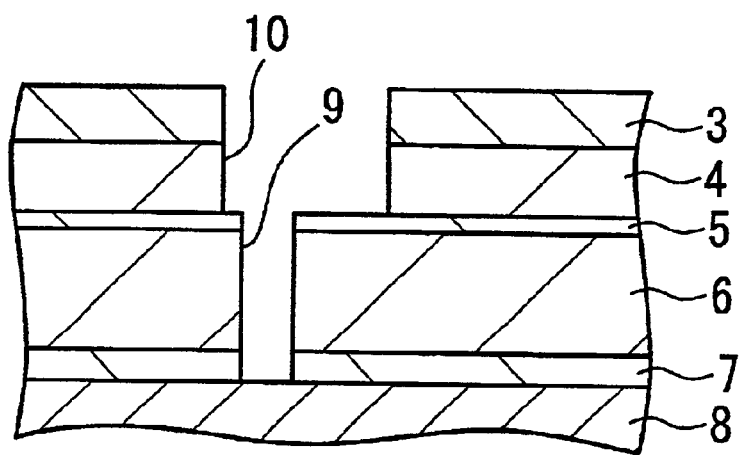

Then, as shown in FIG. 3B, by using $O_2$ plasma ashing and/or organic remover, the photo resist film 1 and the bottom anti-reflective coating 2 are removed. Thereafter, the etching stopper film 7 within the via hole 9 is removed by etching.

Figure 3C:
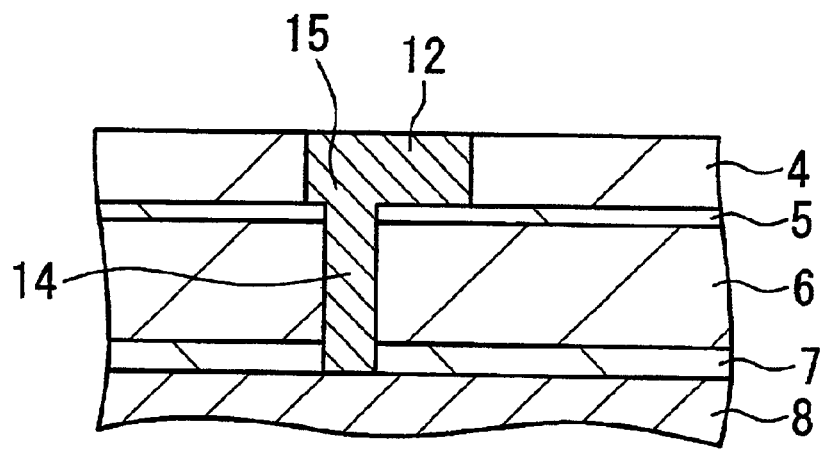

As shown in FIG. 3C, the via hole 9 and the wiring trench 10 are filled with conductive material 12. The conductive material is 12 is, for example, copper (Cu) or copper alloy. Thereby, a via conductor 14 and a wiring conductor 15 are formed. Then, the surface of the cap film 3 is polished by using a Chemical Mechanical Polishing (CMP) method. In this case, all of the conductive material 12 sticking out of the cap film 3 and almost all of the cap film 3 are removed, and the surface of the workpiece is planarized. Thereby, a desired wiring structure is completed.

An explanation will now be made on the reasons for limiting numerical values as mentioned above in various constituents of the present invention.

(1) The reasons why the development rate (dissolving rate) of the exposed portion of the photo resist film for forming the wiring trench is determined to be 250–700 nm/second.

If the development rate of the exposed portion of the photo resist film (maximum development rate) is smaller than 250 nm/second, the development rate of the photo resist formed in the via hole 9 is too low, and, when developed, this photo resist remains undissolved. Therefore, in the process of forming a wiring trench by etching the interlayer insulating film, the undissolved photo resist functions as a mask and etching residue is produced. On the other hand, if the development rate of the exposed portion of the photo resist film is larger than 700 nm/second, in each portion of the photo resist film where a contrast of exposure light decreases, each shoulder portion of the photo resist film becomes round-shaped and rectangularity of a profile of the photo resist film is deteriorated. A decrease in a contrast of exposure light occurs, for example, by the overlap of exposure light between adjacent wiring conductors in a portion where wiring trenches are densely formed. If the rectangularity of a profile of the photo resist film is deteriorated, when the interlayer insulating film is etched by using such photo resist film as a mask to form a wiring trench, the profile or shape of the wiring trench is deteriorated. Therefore, the development rate of the exposed portion of the photo resist film (maximum development rate) for forming a wiring trench is controlled to become between 250–700 nm/second.

(2) The reasons why the development rate of the unexposed portion of the photo resist film for forming the wiring trench is determined to be 0.05–0.4 nm/second.

When the development rate of the unexposed portion of the photo resist film (minimum development rate) is equal to or larger than 0.05 nm/second, it is possible to more surely increase the development rate of the photo resist buried in the via hole. On the other hand, when the development rate of the unexposed portion of the photo resist film is equal to or smaller than 0.4 nm/second, it is possible to avoid over-decrease of the photo resist film at the unexposed portion thereof. Therefore, it is preferable that the development rate of the unexposed portion of the photo resist film for forming the wiring trench is in a range between 0.05–0.4 nm/second.

Figure 4:
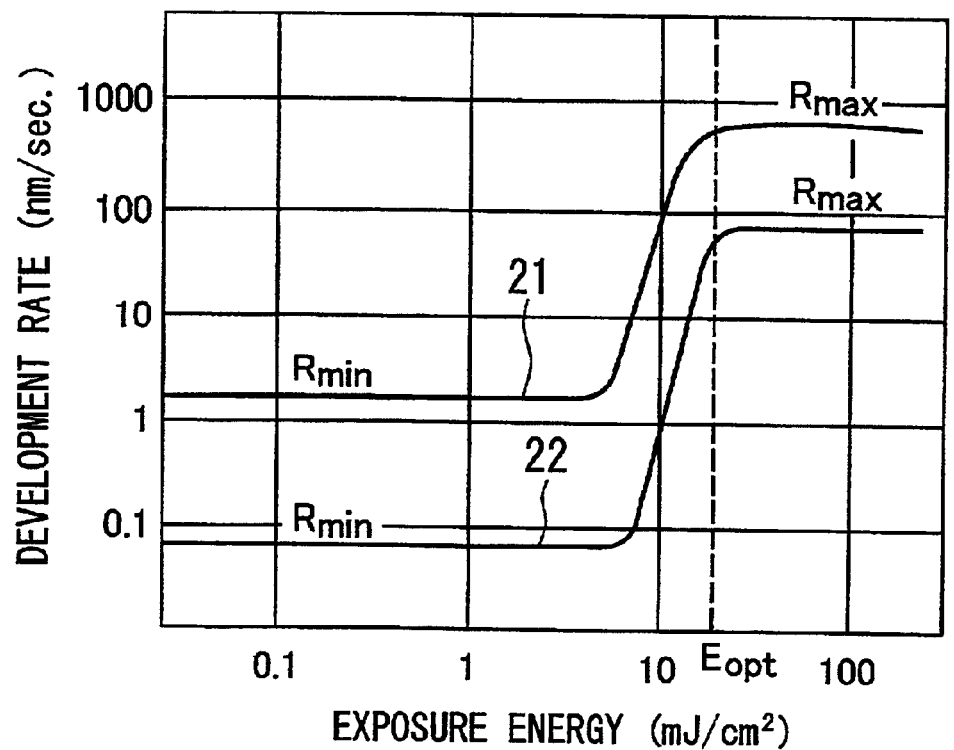
FIG. 4 is a graph showing relationships between exposure energy and developing rate in various photo resist materials.

With reference to the drawings, a more detailed explanation will be made on the reasons why the development rate of the photo resist film for forming the wiring trench is limited within the above-mentioned range. FIG. 4 is a graph showing relationships between exposure energy and developing rate in various photo resist materials. An abscissa of the graph of FIG. 4 designates exposure energy applied onto the photo resist materials, and an ordinate of the graph designates development rate of exposed photo resist in a developer, that is, developing rate (or dissolving rate). In FIG. 4, a curve 21 designates development rate of the photo resist according to the present embodiment, and a curve 22 designates development rate of the conventional photo resist. Also, a symbol $R_{max}$ designates a maximum development rate of each photo resist, and a symbol $R_{min}$ designates a minimum development rate of each photo resist. Further, a symbol $E_{opt}$ designates an optimum exposure energy.

As shown in FIG. 4, for example, in a method of fabricating a wiring conductor according to the present embodiment, it is assumed that the photo resist material having a characteristic shown by the curve 21 is used for forming the photo resist film 1. It is also assumed that exposure energy on the photo resist film 1 formed on the anti-reflective coating 2 (see FIG. 2A) is 20 mJ/cm² which is the optimum exposure energy $E_{opt}$, and exposure energy on the material of the photo resist film 1 formed within the via hole 9 is 10 mJ/cm². In such case, a developing rate of the photo resist film 1 formed within the via hole 9 becomes approximately 100 nm/second. If the developing time is 30 seconds, the photo resist film 1 within the via hole 9 dissolves to a depth of approximately 3 μm, by this development process. Since the thickness of the photo resist film 1 within the via hole 9 is usually several hundreds nm's (nanometers) or so, it is possible to completely dissolve the photo resist film 1 within the via hole 9 in this example.

On the other hand, when the photo resist film 1 is formed by using the conventional photo resist material shown by the curve 22, the development rate of the photo resist film 1 formed within the via hole 9 becomes approximately 1 nm/second. If the developing time is 30 seconds, dissolving thickness of the photo resist film 1 is approximately 30 nm's. Therefore, a part of the photo resist film 1 within the via hole 9 remains undissolved.

In this way, the higher both the maximum development rate and the minimum development rate, the more completely the photo resist film 1 is dissolved away from the via hole 9. However, it is necessary to control the development rates of exposed and unexposed portions of the photo resist film 1 such that the profile or shape of the patterned photo resist film 1 after development can be appropriately maintained. It is also important that the photo resist is formulated with sufficiently high transparency.

Figure 5:
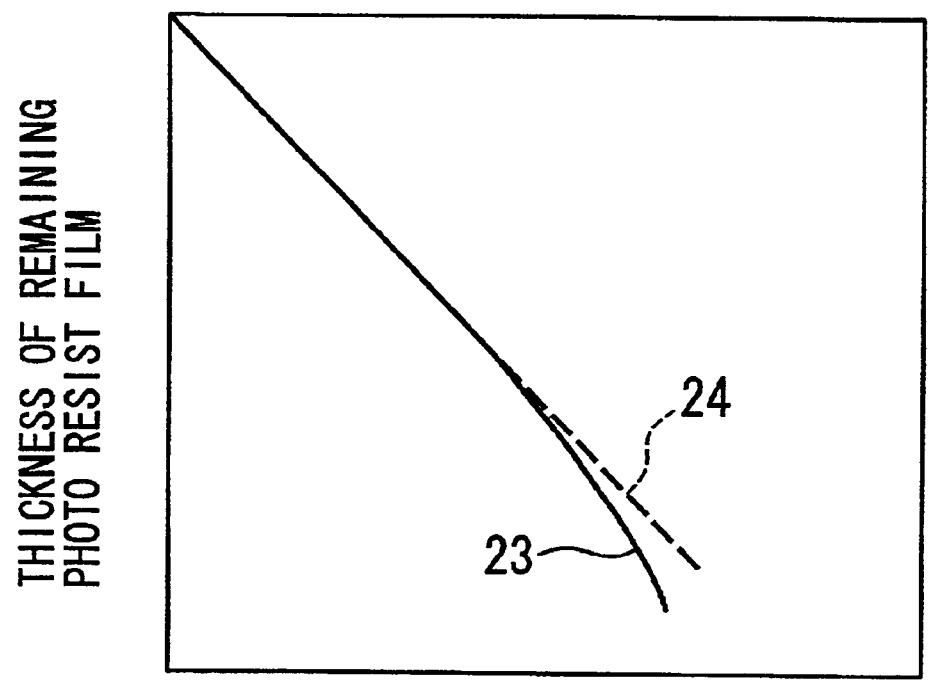
FIG. 5 is a graph showing a result of measurement by a development rate monitor (DRM) during a process of development.

FIG. 5 is a graph showing a result of measurement by a development rate monitor (DRM) during a process of development. An abscissa of the graph of FIG. 5 designates a development time, and an ordinate of the graph designates a film thickness of a photo resist film which remains undissolved. A line 23 shows a relationship between the development time and the film thickness of the remained photo resist film. As shown in FIG. 5, although the line 23 is not a completely straight line, in the present invention, a slope of a tangential line 24 which is tangent to the line 23 at the starting point of development is defined as a developing rate of a photo resist film.

Next, an explanation will be made on a structure of a wiring conductor fabricated by using a method of fabricating a wiring conductor according to the present embodiment. As shown in FIG. 3C, a reference numeral 8 designates a lower wiring layer which may be, for example, an electrode layer of a transistor of a semiconductor device, a wiring layer at a lower layer of a semiconductor device, or the like. On the lower wiring layer 8, an etching stopper film 7 made of SiCN is formed, and an interlayer insulating film 6 made of $SiO_2$ is formed on the etching stopper film 7. Also, on the interlayer insulating film 6, an etching stopper film 5 made of SiC is formed. A via hole 9 is formed which penetrates perpendicularly through the etching stopper film 7, the interlayer insulating film 6 and the etching stopper film 5 (see FIG. 3B). Within the via hole 9, there is formed a via conductor or a via 14 which is made of copper (Cu), copper alloy and the like. The via 14 is electrically coupled with the lower wiring layer 8. On the etching stopper film 5, an interlayer insulating film 4 made of ladder oxide is formed. In the interlayer insulating film 4, a wiring trench 10 (see FIG. 3B) is formed, and within the wiring trench 10, a wiring conductor 15 made of copper (Cu), copper alloy and the like is formed. The wiring conductor 15 is coupled with the via 14.

Figure 16A:
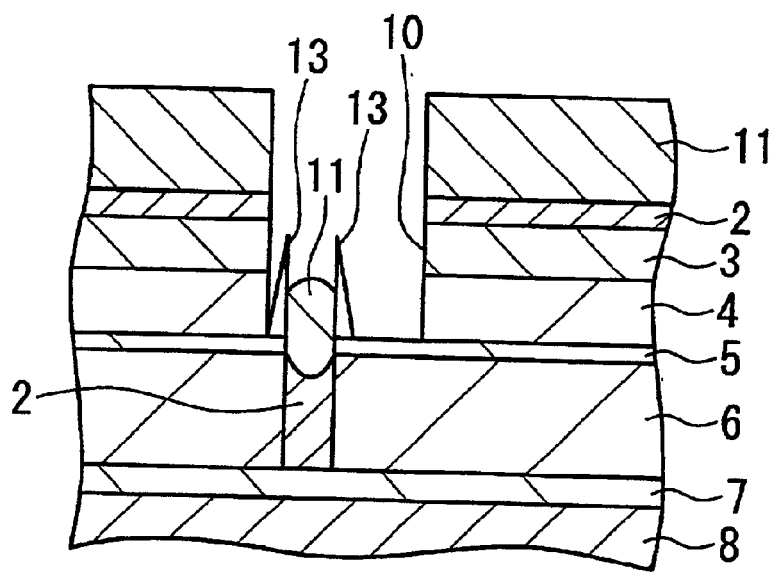
FIGS. 16A–16C are cross sectional views each illustrating a structure of a workpiece obtained after the structure of FIG. 15C during a process of fabricating a dual damascene structure according to the second conventional dual damascene method.
Figure 16B:
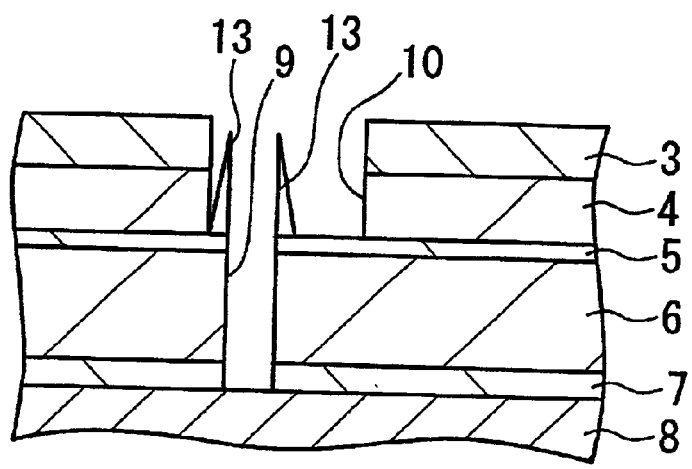
Figure 16C:
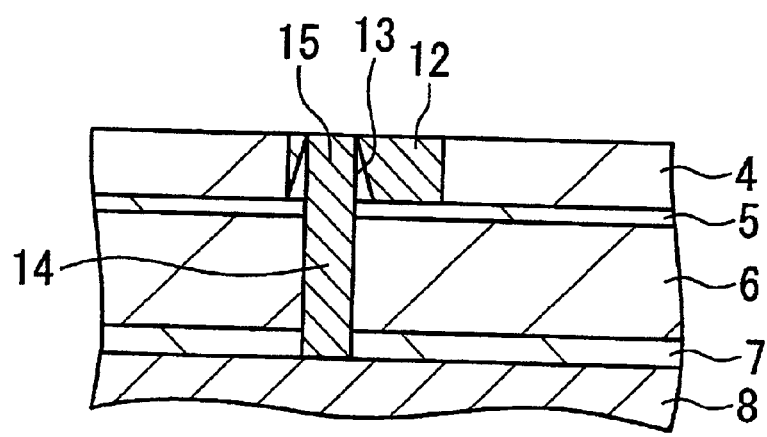

In the dual damascene method of fabricating a wiring conductors according to the present embodiment, the photo resist film 1 is selected such that the development rate of exposed portions thereof, i.e., the maximum development rate, becomes 250 nm/second or higher, and the development rate of unexposed portions thereof, i.e., the minimum development rate, becomes 0.05 nm/second or higher. Thereby, even if, when the photo resist film 1 is exposed as shown in FIG. 2B, quantity of light energy reaching the photo resist film 1 buried in the via hole 9 is relatively small, the photo resist film 1 buried in the via hole 9 can also be sufficiently dissolved in developer when the photo resist film 1 is developed thereafter. Therefore, it is possible to avoid insufficient dissolution of the material of the photo resist film 1 buried in the via hole 9. Thus, when the cap film 3 and the interlayer insulating film 4 is etched as shown in FIG. 3A, it is possible to avoid occurrence of etching residue which was produced in a conventional method of fabricating a wiring conductor (see FIG. 16A). As a result, such etching residue does not remain in the wiring conductor 15, and it is possible to greatly improve reliability of wiring.

Also, in the present embodiment, the development rate of exposed portions of the photo resist film 1, i.e., the maximum development rate, is selected to become 700 nm/second or lower. Therefore, it is possible to maintain rectangularity of the photo resist film 1, that is, it is possible to maintain a rectangular shape of each etched cross section of the photo resist film 1. Also, the development rate of unexposed portions of the photo resist film 1, i.e., the minimum development rate, is selected to become 0.4 nm/second or lower. Thereby, it is possible to avoid missing of film material at unexposed portions of the photo resist film. As a result of these advantages, it is possible to form minute wiring conductors with high precision. Also, according to the present embodiment, it is possible to shorten a time for an anisotropic etching back process of the anti-reflective coating portion buried in the via hole and, therefore, the lateral size of each via hole can be controlled easily and precisely.

Further, in the present embodiment, the anti-reflective coating is provided under the photo resist film. Thereby, it is possible to suppress variation of the film thickness of the photo resist film which may be caused by the interference of the exposure light. Also, by filling the lower portion of the via hole with the material of the anti-reflective coating, it is possible to protect the bottom portion from being etched, in an etching process of a wiring trench.

Second Embodiment

An explanation will now be made on a second embodiment of the present invention. FIGS. 6A–6C, FIGS. 7A–7C and FIG. 8 are cross sectional views each illustrating in order a structure of a workpiece obtained during a process of fabricating a wiring structure by using a dual damascene method according the second embodiment of the present invention. In this embodiment, an anti-reflective coating like that used in the above-mentioned first embodiment is not used. In these drawings, portions identical or corresponding to those in the illustration of the above-mentioned first embodiment are designated by the same reference numerals, and a detailed explanation thereof is omitted here.

Figure 6A:
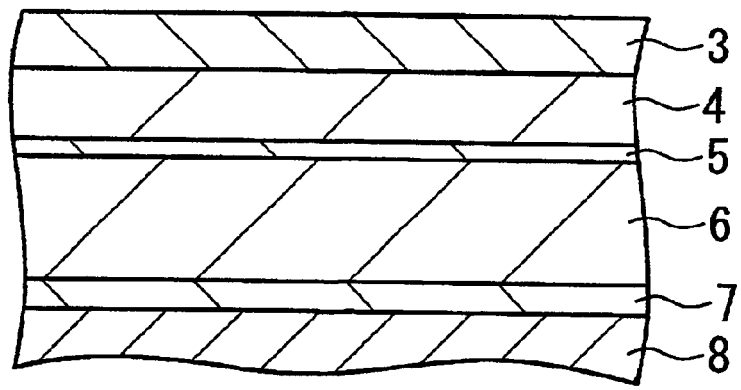
FIGS. 6A–6C are cross sectional views each illustrating in order a structure of a workpiece obtained during a process of fabricating a wiring structure a second embodiment of the present invention.

First, as shown in FIG. 6A, on a lower wiring layer 8, an etching stopper film 7 made of SiCN is formed. The thickness of the etching stopper film 7 is, for example, 70 nm. The lower wiring layer 8 is, for example, an electrode layer of a transistor, a lower layer wiring conductor in a semiconductor device or the like. Then, an $SiO_2$ film is grown by using a plasma enhanced CVD system and, thereby, an interlayer insulating film 6 is formed which has a film thickness of, for example, 600 nm. On the interlayer insulating film 6, an etching stopper film 5 is formed which is made of SiC and which has a film thickness of, for example, 50 nm. Next, an interlayer insulating film 4 is formed which is made of ladder oxide and which has low dielectric constant and has a film thickness of, for example, 300 nm. On the interlayer insulating film 4, $SiO_2$ is deposited to a thickness of, for example, 250 nm by using a plasma enhanced CVD system, and thereby a cap film 3 is formed.

A photo resist film (not shown in the drawing) is then applied on the cap film 3. The photo resist film is then exposed by using KrF (krypton fluoride) excimer laser, and thereafter developed. Thereby, a via hole pattern is formed by a photolithography technology in the photo resist film. In the drawings, only one via hole is shown. However, in practice, it is possible to form many via holes at the same time.

Figure 6B:
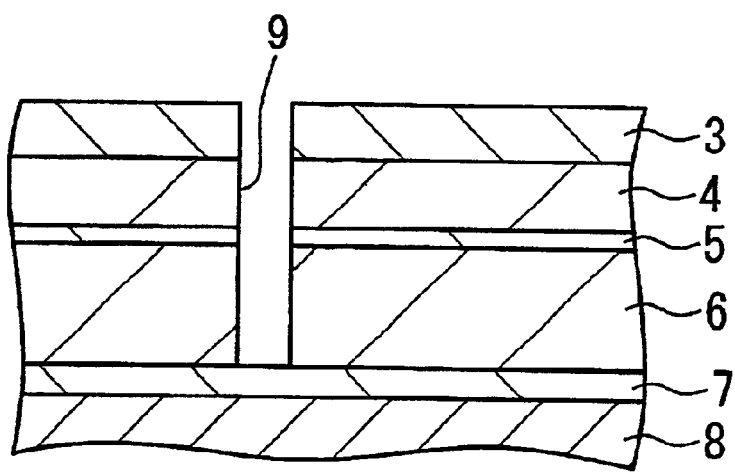

As shown in FIG. 6B, by using the photo resist film (not shown in the drawing) in which the via hole pattern is formed as mentioned above as a photo mask, the cap film 3, the interlayer insulating film 4, the etching stopper film 5 and the interlayer insulating film 6 are etched, thereby a via hole 9 reaching the etching stopper film 7 is formed. Thereafter, by using $O_2$ plasma ashing and/or organic remover, the photo resist film is removed.

Figure 6C:
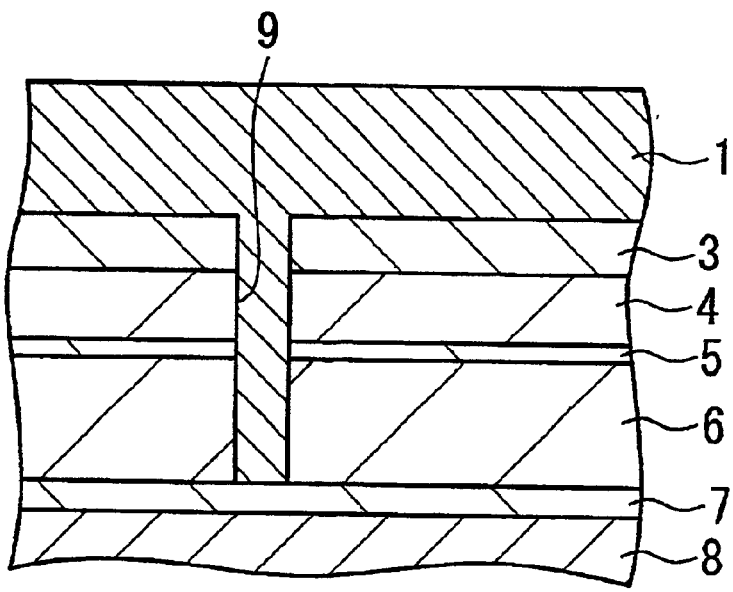

Next, as shown in FIG. 6C, a positive type photo resist material or film 1 is applied on the cap film 3 and within the via hole 9 such that the space within the via hole 9 is filled with the positive type photo resist material. The photo resist film 1 is selected such that the development rate of exposed portions thereof, i.e., the maximum development rate, becomes 250–700 nm/second, and the development rate of unexposed portions thereof, i.e., the minimum development rate, becomes 0.05–0.4 nm/second. The thickness of the photo resist film 1 on the cap film 3 is, for example, 600 nm. The photo resist film 1 may be, for example, made of acetal resist or ESCAP resist material mentioned above.

Figure 7A:
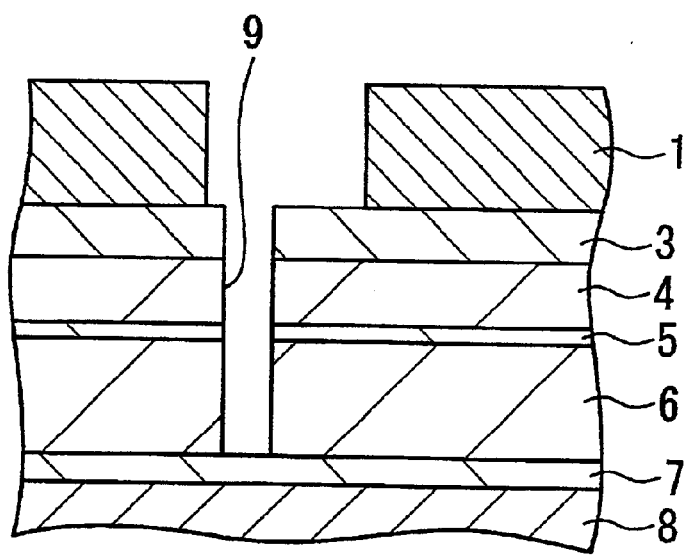
FIGS. 7A–7C are cross sectional views each illustrating in order a structure of a workpiece obtained after the structure of FIG. 6C during a process of fabricating a wiring structure according a second embodiment of the present invention.

Then, as shown in FIG. 7A, the photo resist film 1 is exposed by using KrF excimer laser by using a KrF scanner or scanning exposure system. Thereafter, the photo resist film 1 is developed and, thereby, a trench pattern is formed by a photolithography technology. In the drawings, only one trench pattern portion is shown. However, in practice, it may be possible to form many trench pattern portions at the same time. In this case, for example, an aqueous solution of TMAH (tetra-methyl-ammonium-hydroxide) having a concentration of 2.38 wt % (percent by mass) is used as a developer. The development time is, for example, 30 seconds. By this development process, photo resist material 1 within the via hole 9 is dissolved in the developer and removed.

Figure 7B:
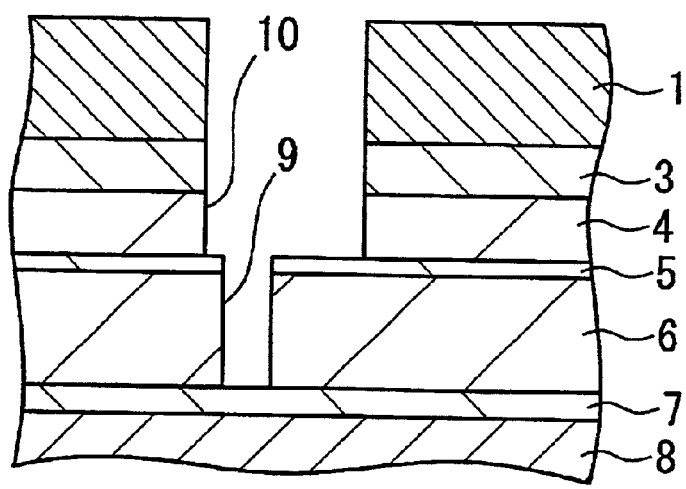

As shown in FIG. 7B, by using the photo resist film 1 in which the trench pattern is formed as a mask, the cap film 3 and the interlayer insulating film 4 are etched and thereby a wiring trench 10 is formed. In this case, etching is stopped by and at the etching stopper film 5.

Figure 7C:
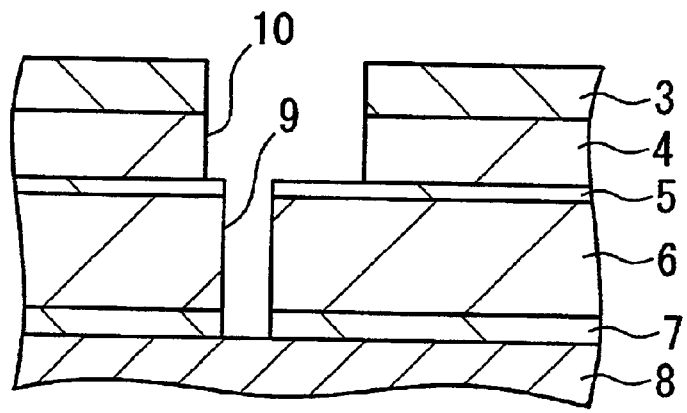

Then, as shown in FIG. 7C, by using $O_2$ plasma ashing and/or organic remover, the photo resist film 1 is removed. Thereafter, the etching stopper film 7 within the via hole 9 is removed by etching.

Figure 8:
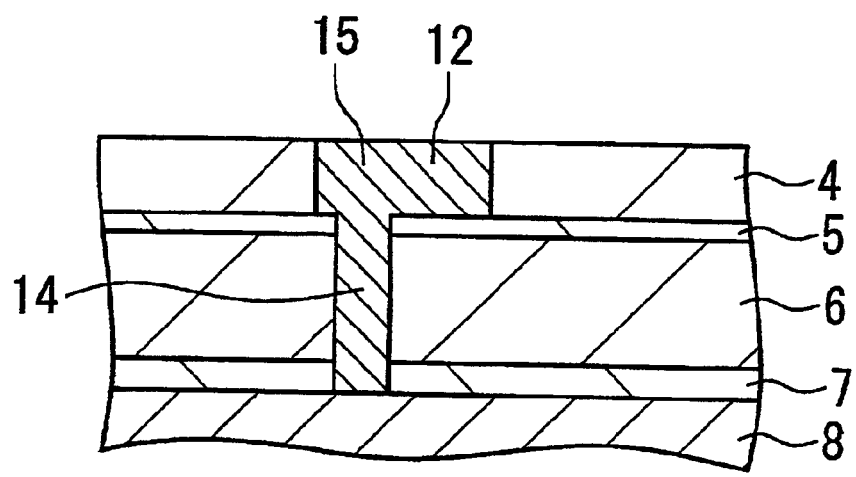
FIG. 8 is a cross sectional view illustrating a structure of a workpiece obtained after the structure of FIG. 7C during a process of fabricating a wiring structure according a second embodiment of the present invention.

As shown in FIG. 8, the via hole 9 and the wiring trench 10 are filled with conductive material 12. The conductive material is 12 is, for example, copper (Cu), copper alloy and the like. Thereby, a via conductor 14 and a wiring conductor 15 are formed. Then, the surface of the cap film 3 is polished by using a Chemical Mechanical Polishing (CMP) method. In this case, all of the conductive material 12 on the cap film 3 and almost all of the cap film 3 are removed, and the surface of the workpiece is planarized. Thereby, a desired wiring structure is completed. The wiring structure obtained by using the method of forming wiring conductors according to the above-mentioned second embodiment of the present invention is the same as the wiring structure obtained by using the method of forming wiring conductors according to the first embodiment of the present invention mentioned before.

By using the dual damascene method of forming wiring conductors according to the second embodiment of the present invention, it is possible to similarly obtain the advantageous effects which are realized by using the method according to the first embodiment. In addition to such effects, it is possible to obtain the following effect, by using the second embodiment. That is, since, in this embodiment, an anti-reflective coating is not formed, incident exposure light inputted to the via hole 9 is reflected at the bottom portion of the material of the photo resist film 1 buried within the via hole 9. Therefore, exposure energy of light irradiating the photo resist material within the via hole 9 becomes large, and it is possible to increase a development rate of the photo resist material. As a result, it is possible to more surely prevent the material of the photo resist film 1 from remaining undissolved within the via hole 9.

In general, the photo resist comprises a polymer, an acid generator and various additives, and by changing the kind and composition ratio of these components, it is possible to control exposure characteristics. In the above-mentioned first and second embodiments, KrF excimer laser was used as exposure light, and acetal resist or ESCAP resist was used as the material of the photo resist film 1. However, in the present invention, the kind of polymer of the photo resist film 1 is not limited to a particular type of resist material, but may be any suitable polymer and the like as long as the resist material has a predetermined desired development rate. Also, in the present invention, it is possible to use ArF excimer laser having a wavelength of 193 nm, in place of KrF excimer laser. In such case, the kind of material of the photo resist film 1 is not limited to a particular one, but may be any kind of photo resist material which is photosensitive to the ArF laser and which has a predetermined development rate. For example, the photo resist may be methacrylate resist which is fabricated by adding photo acid generator and additive(s) to poly(ester methacrylate). Also, it is preferable that the photo resist has sufficiently high transparency to dissolve the photo resist material in the via hole.

Also, the interlayer insulating film 4 may be made of a low dielectric constant film such as SiLK, SiOF or the like, or may be made of silicon oxide. Further, the etching stopper film 5 is not limited to a film made of SiC, but may be a film made of SiN, SiON, SiCN or the like. Also, the etching stopper film 7 is not limited to a film made of SiCN, but may be a film made of SiC, SiN, SiON or the like.

EXAMPLES

With reference to some examples according to the present invention and some comparative examples out of the scope of claims for patent, an explanation will now be made on advantageous effects of the present invention.

Example 1

Figure 9A:
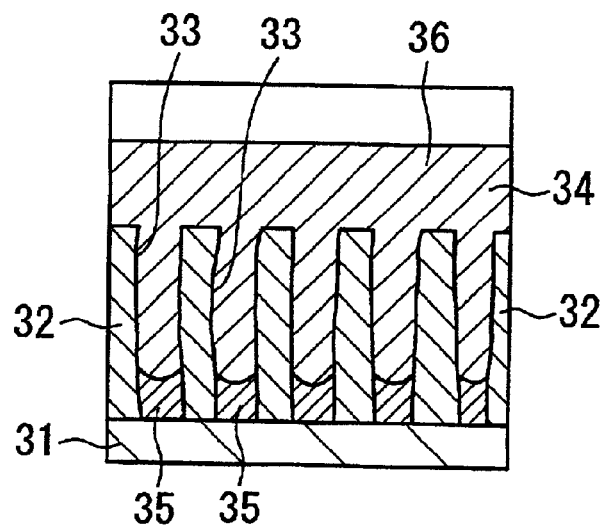
FIGS. 9A–9C are schematic illustrations obtained by tracing observation results of cross sections of wiring trenches and via holes by a Scanning Electron Microscope (SEM) in a process of forming wiring structures which uses various photo resist materials.
Figure 9B:
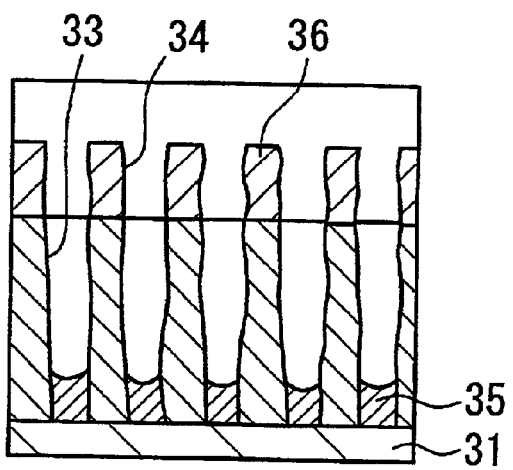
Figure 9C:
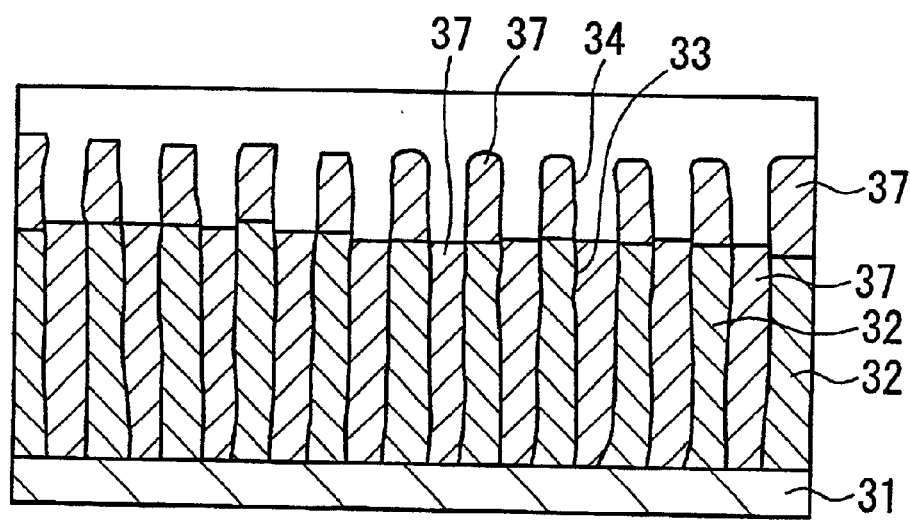

With reference to FIGS. 9A–9C, an explanation will be made on Example 1. Wiring structures were fabricated by using the method in accordance with the first embodiment mentioned above. In this case, two kinds of photo resist were used. That is, a photo resist according to the present invention which has the maximum development rate of 250–700 nm/second and the minimum development rate of 0.05–0.4 nm/second, and a conventional photo resist which has the maximum development rate of 50–200 nm/second and the minimum development rate of 0.005–0.05 nm/second were prepared.

FIG. 9A through FIG. 9C are schematic illustrations obtained by tracing the observation result of cross sections of wiring trenches and via holes by a Scanning Electron Microscope (SEM) in processes of forming the wiring structures. FIG. 9A shows a cross sectional view of a workpiece before exposing the photo resist, that is, in a process corresponding to the process described with reference to FIG. 2A in the above-mentioned first embodiment. FIG. 9B and FIG. 9C show cross sectional views of workpieces after developing the photo resist, that is, in processes corresponding to the process described with reference to FIG. 3A in the above-mentioned first embodiment. In this case, FIG. 9B shows a cross sectional view when the photo resist according to the present embodiment is used, and FIG. 9C shows a cross sectional view when the conventional photo resist is used.

As shown in FIG. 9A, before exposing the photo resist, there is formed, on a lower wiring layer 31, an interlayer insulating film 32 which corresponds to the etching stopper film 7, the interlayer insulating film 6, etching stopper film 5, the interlayer insulating film 4, the cap film 3 and the anti-reflective coating 2 in FIG. 2A. The interlayer insulating film 32 has via holes 33 and wiring trench or trenches 34 formed therein. Within the via holes 33, there are formed anti-reflective coating portions 35. Within the via holes 33 and the wiring trenches 34, the photo resist 36 according to the present invention is formed.

In the wiring structure shown in FIG. 9A, the photo resist 36 was then exposed and developed, and thereby the structure shown in FIG. 9B was obtained. As shown in FIG. 9B, when the photo resist according to the present embodiment was used, although rectangular photo resist portions 36 were formed on respective portion of the interlayer insulating film 32, the photo resist 36 did not remain within each via hole 33.

On the other hand, as shown in FIG. 9C, when the conventional photo resist 37 was used, portions of the photo resist 37 remained within each via hole 33 even after the photo resist 37 was exposed and developed.

Example 2

Next, with reference to a table shown in FIG. 17, an explanation will be made on Example 2. Wiring structures were formed by using the method according to the first embodiment mentioned above. Both the width of a via hole and the width of a wiring trench were 0.2 μm. The total height of the via hole and the wiring trench was 1.2 μm. In this case, as photo resist materials, nine (9) kinds of photo resist A through J were used which have different maximum development rates and different minimum development rates. For each photo resist, removability of the photo resist at a development process and rectangularity of the photo resist after development were evaluated as shown in FIG. 17. Exposure was done by using a KrF excimer laser. The photo resist H, I and J are photo resist materials each of which has good line pattern forming characteristics. Evaluation of the removability was done based on the focus range of exposure light at an exposure process in which the photo resist can be removed from the via hole. For example, a photo resist which can be removed by development even when exposure light is defocused is considered to have good removability. That is, the larger the removability of the photo resist is, the wider the focus range is. Evaluation of the rectangularity of the photo resist after development was done by observing the profile of the photo resist after development by using the SEM. In FIG. 17, a symbol "⊚" designates a condition in which rectangularity of the photo resist was very good, a symbol "○" designates a condition in which rectangularity of the photo resist was good, and a symbol "X" designates a condition in which each shoulder portion of the photo resist became round and rectangularity was not good. FIG. 17 shows the maximum development rates and the minimum development rates of the photo resist A through J, together with the result of evaluation of the removability and rectangularity of the photo resist A through J.

In FIG. 17, the photo resist samples Nos. 2–6 are those belonging to the examples according to the present invention. The maximum development rate of the photo resist samples of Nos. 2–6 is in a range between 250 nm/second and 700 nm/second, and therefore these photo resist showed good removability and good rectangularity. Especially, examples 3–6 have minimum development rates in a range from 0.05 through 0.4 nm/second, and therefore have balanced good performance of both removability and rectangularity of the photo resist.

On the other hand, the photo resist samples No. 1 and Nos. 7–9 are comparative examples. The comparative example No. 1 has a large maximum development rate of 800 nm/second, and, therefore, shoulder portions of the photo resist after development became round and rectangularity was not good. Each of the photo resist sample Nos. 7–9 has a relatively small maximum development rate that is smaller than 250 nm/second. Therefore, even if the focus range of exposure was adjusted, the photo resist did not removed completely from the via hole but remained in the via hole. That is, removability was not good.

Figure 10A:
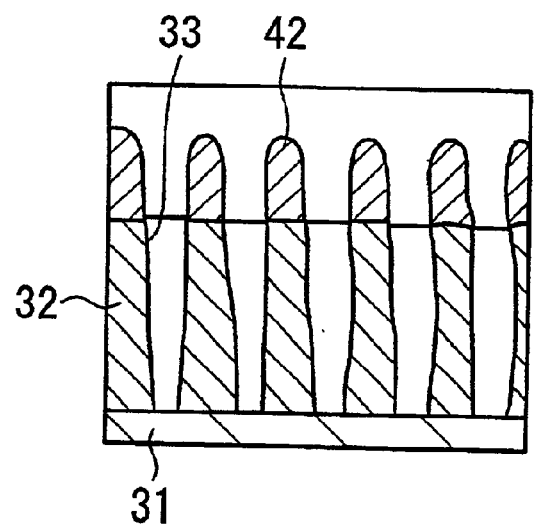
FIG. 10A, FIG. 10B and FIG. 10C are schematic illustrations obtained by tracing observation results of cross sections of wiring trenches and via holes after developing photo resist materials of examples Nos. 3 and 4 and of comparative example No. 7, respectively, by a Scanning Electron Microscope (SEM)
Figure 10B:
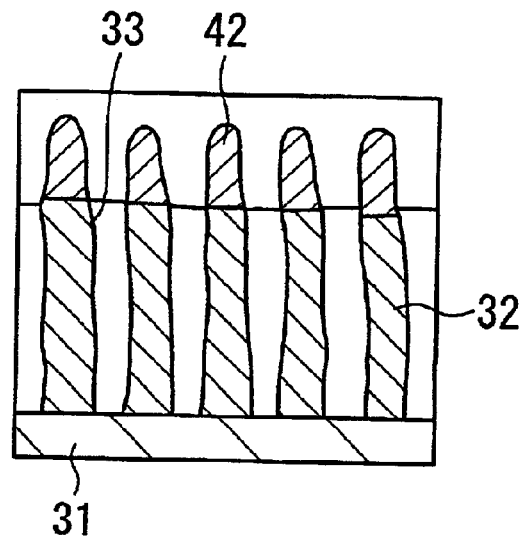
Figure 10C:
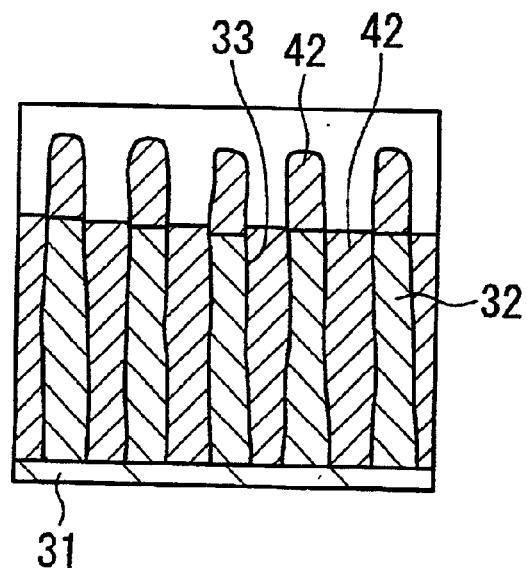
Figure 11A:
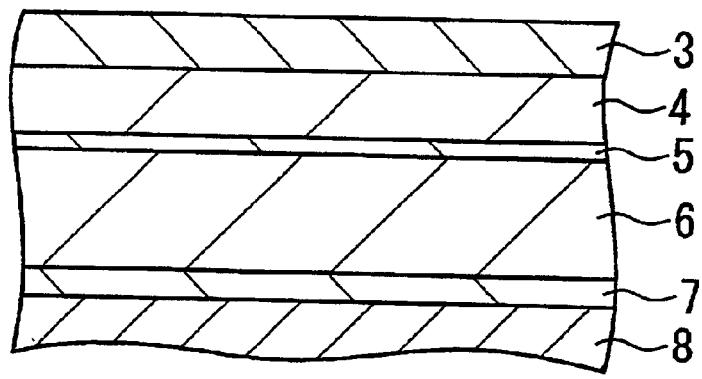
FIGS. 11A–11C are cross sectional views each illustrating a structure of a workpiece during a process of fabricating a dual damascene structure according to a first conventional dual damascene method.
Figure 11B:
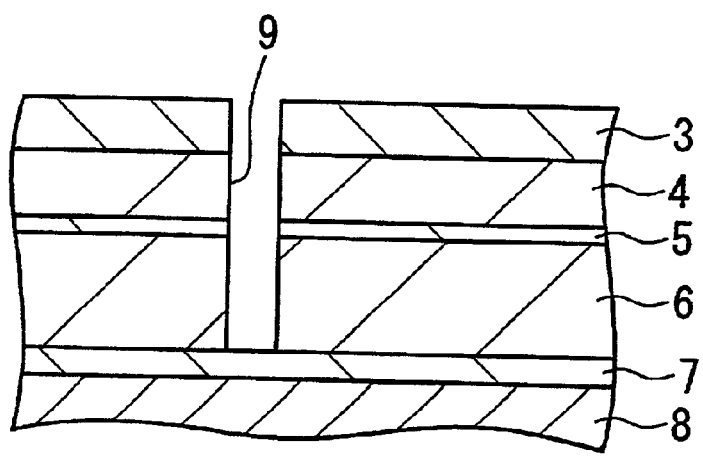
Figure 11C:
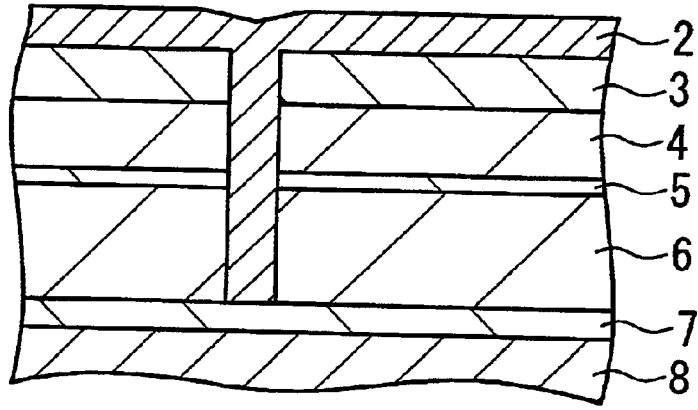
Figure 12A:
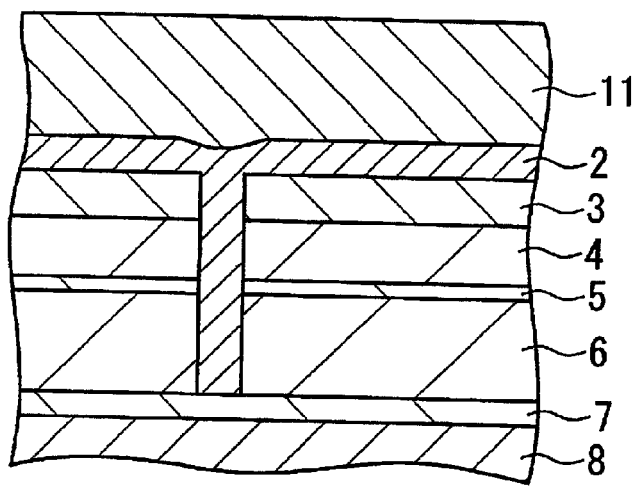
FIGS. 12A–12C are cross sectional views each illustrating a structure of a workpiece obtained after the structure of FIG. 11C during a process of fabricating a dual damascene structure according to the first conventional dual damascene method.
Figure 12B:
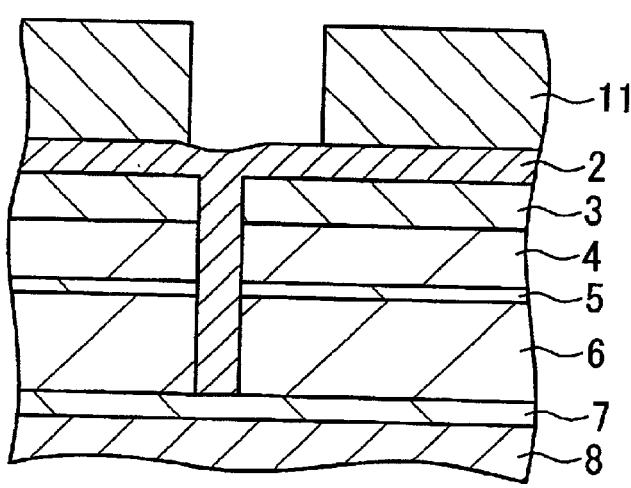
Figure 12C:
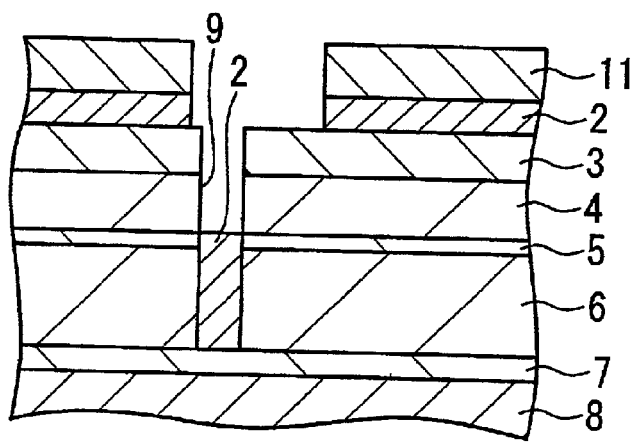
Figure 13A:
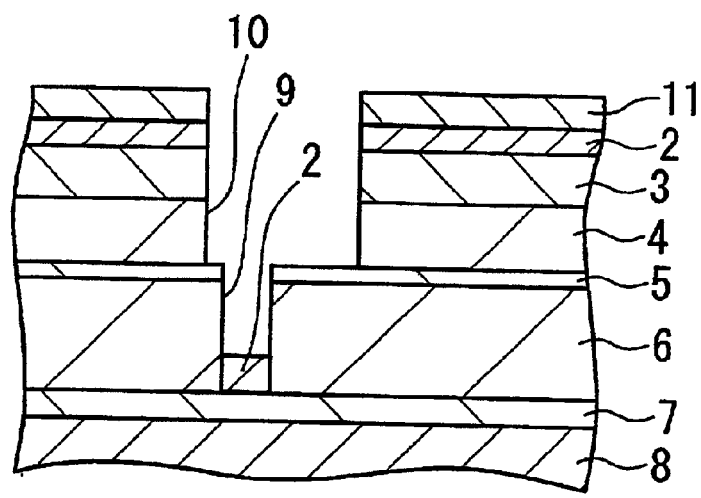
FIGS. 13A–13C are cross sectional views each illustrating a structure of a workpiece obtained after the structure of FIG. 12C during a process of fabricating a dual damascene structure according to the first conventional dual damascene method.
Figure 13B:
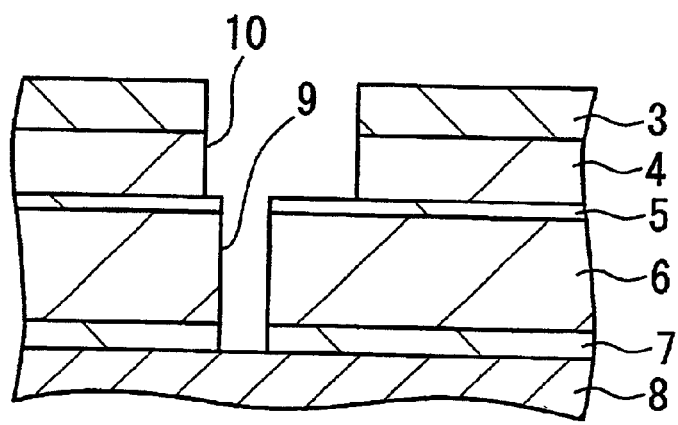
Figure 13C:
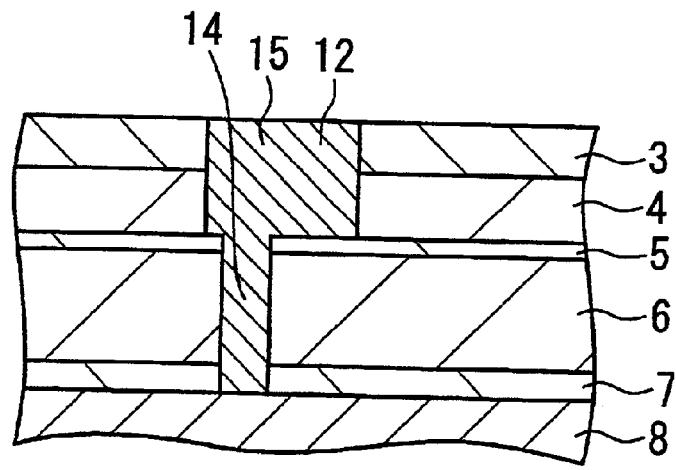
Figure 14A:
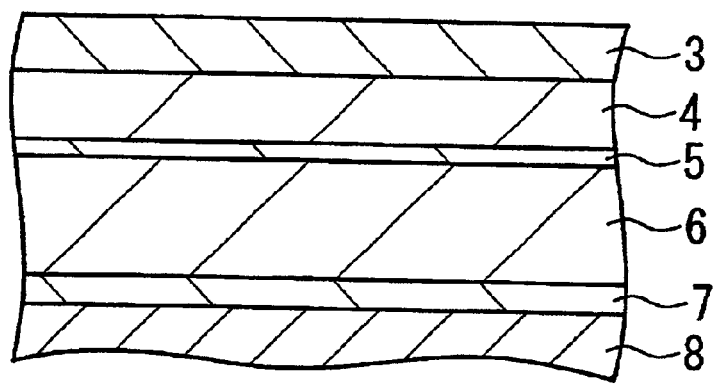
FIGS. 14A–14C are cross sectional views each illustrating a structure of a workpiece during a process of fabricating a dual damascene structure according to a second conventional dual damascene method.
Figure 14B:
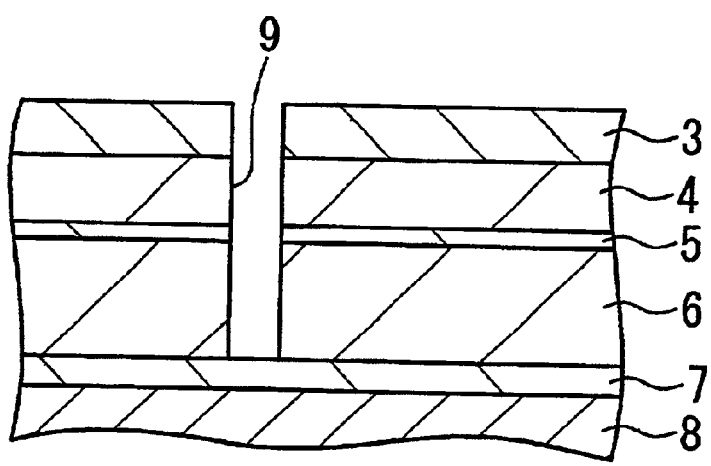
Figure 14C:
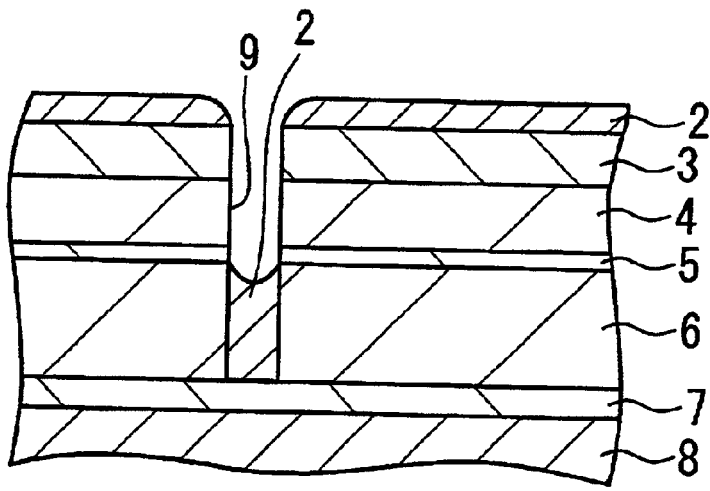
Figure 15A:
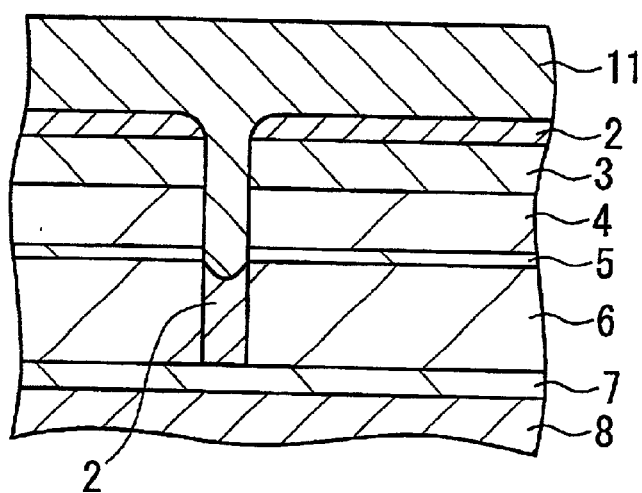
FIGS. 15A–15C are cross sectional views each illustrating a structure of a workpiece obtained after the structure of FIG. 14C during a process of fabricating a dual damascene structure according to the second conventional dual damascene method.
Figure 15B:
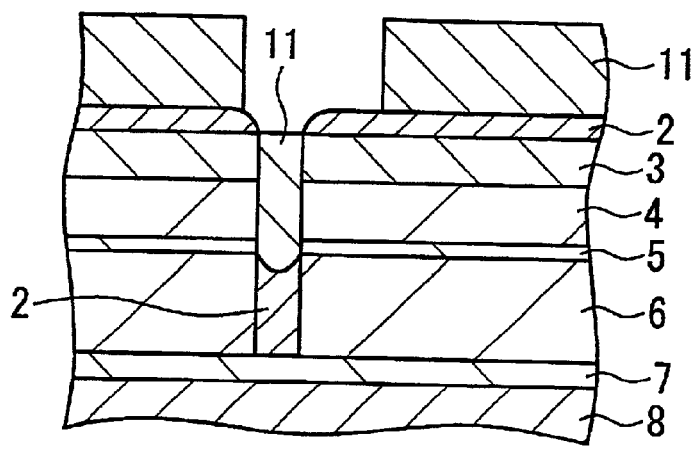
Figure 15C:
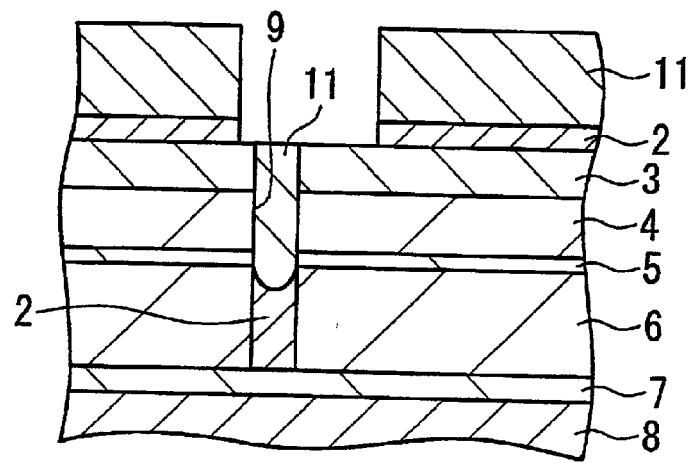

FIG. 10A, FIG. 10B and FIG. 10C are schematic illustrations obtained by tracing the observation result of cross sections of wiring trenches and via holes after developing the photo resist of the examples Nos. 3 and 4 and of the comparative example No. 7, respectively, by a Scanning Electron Microscope (SEM). As shown in FIGS. 10A and 10B, the photo resist material did not remain in the via hole 33 in the examples Nos. 3 and 4. However, as shown in FIG. 10C, in the comparative example No. 7, photo resist material 42 remained in each via hole 33.

As mentioned above in detail, in fabricating a dual damascene wiring structure by using a partially-filling method in which a lateral size of each via hole can be easily controlled, it is possible to surely prevent a photo resist material from remaining undissolved in the via hole after exposure and development of the photo resist material. Thereby, it is possible to avoid occurrence of the "crown" mentioned before.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A method of forming a wiring structure by using a dual damascene process comprising:
    forming a first interlayer insulating film on a lower conductive layer;
    forming a second interlayer insulating film on the first interlayer insulating film;
    forming a first photo resist film on the second interlayer insulating film, the first photo resist film having an opening for forming a via hole;
    etching the first and second interlayer insulating films by using the first photo resist film as a mask to form a via hole;
    forming an anti-reflective coating on the second interlayer insulating film such that a portion of the via hole is also filled with the material of the anti-reflective coating;
    forming a second photo resist film on the anti-reflective coating such that a remaining portion of the via hole is also filled with the material of the second photo resist film, a development rate of an exposed portion of the second photo resist film being 250–700 nm/second;
    exposing and developing the second photo resist film by using a photolithography technology and thereby forming an opening for forming a wiring trench in the second photo resist film;
    etching the anti-reflective coating and the second interlayer insulating film by using the second photo resist film as a mask to form a wiring trench;
    removing the second photo resist film and the anti-reflective coating; and
    filling the via hole and the wiring trench with a conductive material to form a via portion which is coupled with the lower conductive layer and a wiring conductor portion which is coupled with the via portion.

2. A method of forming a wiring structure by using a dual damascene process as set forth in claim 1, wherein, in said etching the anti-reflective coating, the level of an upper surface of the anti-reflective coating in the via hole after etching is lower than the level of an upper surface of the first interlayer insulating film.

3. A method of forming a wiring structure by using a dual damascene process as set forth in claim 1, wherein a development rate of an unexposed portion of the second photo resist film is 0.05–0.4 nm/second.

4. A method of forming a wiring structure by using a dual damascene process as set forth in claim 1, wherein the second photo resist film is made of a methacrylate resist material, and the second photo resist film is exposed by using ArF excimer laser.

5. A method of forming a wiring structure by using a dual damascene process as set forth in claim 1, wherein the second photo resist film is made of an acetal photo resist material or an ESCAP resist material, and the second photo resist film is exposed by using KrF excimer laser.

6. A method of forming a wiring structure by using a dual damascene process as set forth in claim 1, further comprising, after said filling the via hole and the wiring trench with a conductive material to form a via portion and a wiring conductor portion, removing the conductive material on the second interlayer insulating film by CMP.

7. A method of forming a wiring structure by using a dual damascene process as set forth in claim 1, further comprising forming a first etching stopper film between the lower conductive layer and the first interlayer insulating film, and wherein, in said etching the first and second interlayer insulating films to form a via hole, said etching is stopped at the first etching stopper film.

8. A method of forming a wiring structure by using a dual damascene process as set forth in claim 1, further comprising forming a second etching stopper film between the first interlayer insulating film the second interlayer insulating film, and wherein, in said etching the second interlayer insulating films to form a wiring trench, said etching is stopped at the second etching stopper film.

9. A method of forming a wiring structure by using a dual damascene process as set forth in claim 1, wherein the first interlayer insulating film is formed of $SiO_2$.

10. A method of forming a wiring structure by using a dual damascene process as set forth in claim 1, wherein the second interlayer insulating film is formed of at least one kind of materials selected from a group consisting of silicon oxide, ladder oxide, SiLK and SiOF.

11. A method of forming a wiring structure by using a dual damascene process as set forth in claim 1, wherein the conductive material is copper or copper alloy.

12. A method of forming a wiring structure by using a dual damascene process as set forth in claim 1, wherein the lower conductor layer is a lower wiring layer.

13. A method of forming a wiring structure by using a dual damascene process as set forth in claim 1, wherein the lower conductor layer is an electrode layer of a transistor formed on the surface of a substrate.

14. A method of forming a wiring structure by using a dual damascene process comprising:

forming a first interlayer insulating film on a lower conductive layer;

forming a second interlayer insulating film on the first interlayer insulating film;

forming a first photo resist film on the second interlayer insulating film, the first photo resist film having an opening for forming a via hole;

etching the first and second interlayer insulating films by using the first photo resist film as a mask to form a via hole;

forming a second photo resist film on the second photo resist film such that the via hole is also filled with the material of the second photo resist film, a development rate of an exposed portion of the second photo resist film being 250–700 nm/second;

exposing and developing the second photo resist film by using a photolithography technology and thereby forming an opening for forming a wiring trench in the second photo resist film;

etching the second interlayer insulating film by using the second photo resist film as a mask to form a wiring trench;

removing the second photo resist film; and filling the via hole and the wiring trench with a conductive material to form a via portion which is coupled with the lower conductive layer and a wiring conductor portion which is coupled with the via portion.

15. A method of forming a wiring structure by using a dual damascene process as set forth in claim 14, wherein a development rate of an unexposed portion of the second photo resist film is 0.05–0.4 nm/second.

16. A method of forming a wiring structure by using a dual damascene process as set forth in claim 14, wherein the second photo resist film is made of a methacrylate resist material, and the second photo resist film is exposed by using ArF excimer laser.

17. A method of forming a wiring structure by using a dual damascene process as set forth in claim 14, wherein the second photo resist film is made of an acetal photo resist material or an ESCAP resist material, and the second photo resist film is exposed by using KrF excimer laser.

18. A method of forming a wiring structure by using a dual damascene process as set forth in claim 14, further comprising, after said filling the via hole and the wiring trench with a conductive material to form a via portion and a wiring conductor portion, removing the conductive material on the second interlayer insulating film by CMP.

19. A method of forming a wiring structure by using a dual damascene process as set forth in claim 14, further comprising forming a first etching stopper film between the lower conductive layer and the first interlayer insulating film, and wherein, in said etching the first and second interlayer insulating films to form a via hole, said etching is stopped at the first etching stopper film.

20. A method of forming a wiring structure by using a dual damascene process as set forth in claim 14, further comprising forming a second etching stopper film between the first interlayer insulating film the second interlayer insulating film, and wherein, in said etching the second interlayer insulating films to form a wiring trench, said etching is stopped at the second etching stopper film.

* * * * *